United States Patent
Chen et al.

(10) Patent No.: US 11,830,936 B2
(45) Date of Patent: Nov. 28, 2023

(54) GATE FORMATION WITH VARYING WORK FUNCTION LAYERS

(71) Applicant: Taiwan Semiconductor Manufacturing Company, Ltd., Hsinchu (TW)

(72) Inventors: Jin-Dah Chen, Hsinchu (TW); Stan Chen, Taipei (TW); Han-Wei Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/649,378

(22) Filed: Jan. 31, 2022

(65) Prior Publication Data
US 2022/0157973 A1    May 19, 2022

Related U.S. Application Data

(60) Continuation of application No. 16/853,912, filed on Apr. 21, 2020, now Pat. No. 11,239,345, which is a division of application No. 15/609,886, filed on May 31, 2017, now Pat. No. 10,644,134.

(51) Int. Cl.
| | |
|---|---|
| *H01L 29/66* | (2006.01) |
| *H01L 29/78* | (2006.01) |
| *H01L 29/06* | (2006.01) |
| *H01L 29/423* | (2006.01) |
| *H01L 29/49* | (2006.01) |
| *H01L 27/092* | (2006.01) |
| *H01L 21/8238* | (2006.01) |

(52) U.S. Cl.
CPC ........ *H01L 29/66795* (2013.01); *H01L 21/823821* (2013.01); *H01L 21/823842* (2013.01); *H01L 27/0924* (2013.01); *H01L 29/0649* (2013.01); *H01L 29/42364* (2013.01); *H01L 29/42372* (2013.01); *H01L 29/4958* (2013.01); *H01L 29/785* (2013.01)

(58) Field of Classification Search
CPC .......... H01L 29/7855–7856; H01L 2029/7858
See application file for complete search history.

(56) References Cited

U.S. PATENT DOCUMENTS

| | | | |
|---|---|---|---|
| 8,481,247 B2 | 7/2013 | Horiguchi et al. | |
| 10,002,791 B1 | 6/2018 | Bao et al. | |
| 2016/0056181 A1* | 2/2016 | Anderson | H01L 21/823481 |
| | | | 438/157 |
| 2016/0365347 A1 | 12/2016 | Bao et al. | |
| 2018/0151573 A1 | 5/2018 | Li | |
| 2018/0151575 A1* | 5/2018 | Li | H01L 21/28079 |

* cited by examiner

*Primary Examiner* — Jay C Chang
*Assistant Examiner* — Mikka Liu
(74) *Attorney, Agent, or Firm* — Slater Matsil, LLP

(57) ABSTRACT

A structure and a method of forming are provided. A first work function layer is formed over a first fin and terminates closer to the first fin than an adjacent second fin. A second work function layer is formed over the first work function layer and terminates closer to the second fin than the adjacent second fin. A third work function layer is formed over the first work function layer and the second fin. A conductive layer is formed over the third work function layer.

20 Claims, 21 Drawing Sheets

GATE FORMATION WITH VARYING WORK FUNCTION LAYERS

PRIORITY CLAIM AND CROSS-REFERENCE

This application is a continuation of U.S. application Ser. No. 16/853,912, filed on Apr. 21, 2020, now U.S. Pat. No. 11,239,345, issued Feb. 1, 2022, which is a divisional of U.S. application Ser. No. 15/609,886, filed on May 31, 2017, now U.S. Pat. No. 10,644,134, issued May 5, 2020, each application is hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to suit the requirements of the NMOS devices and PMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
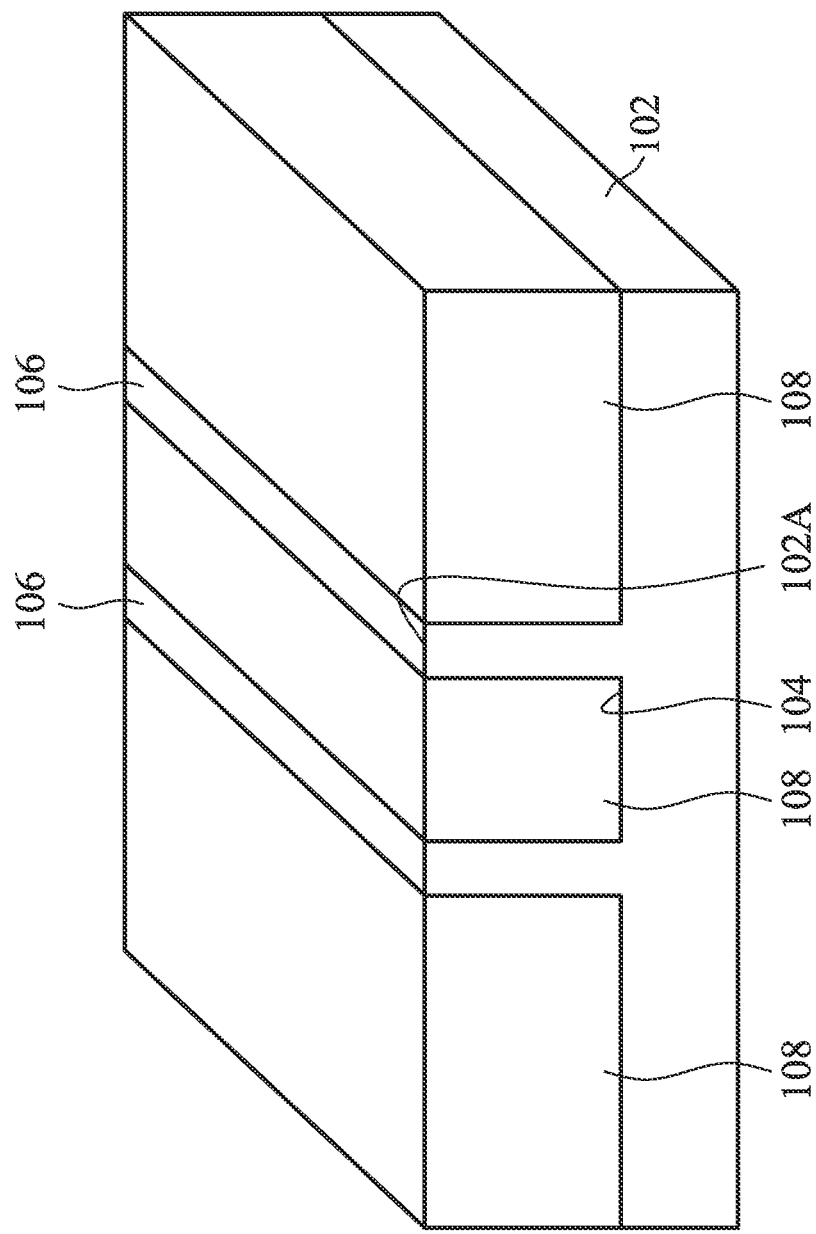
FIGS. 1 through 20B illustrate various intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the embodiments of the present disclosure. Planar transistors may also adopt the concept of the present disclosure.

FIGS. 1 through 20B illustrate various intermediate stages in fabricating FinFETs in accordance with some embodiments of the present disclosure. The process described herein relates to forming multiple transistors having different operating characteristics that may share a common gate. For example, in an embodiment a p-type transistor and an n-type transistor may share a common gate in, for example, an inverter. In situations such as these, it may be desirable to adjust the gate electrode such that the work function of the gate electrode is tuned for the particular operating characteristics. Throughout the description, when a metal layer is referred to as a work-function metal, it indicates it has a work function that fits the type of the respective FinFET, and its location in the metal gate allows its work function to affect or determine the work function of the respective FinFET. For example, when the FinFET is an n-type FinFET, the work-function metal preferably has a low work function, which is lower than the mid-gap work function (about 4.5 eV). The work function of the respective work-function metal may be referred to as an n-work function, which is lower than about 4.3 eV, and may be in the range between about 3.9 eV and about 4.3 eV. When the FinFET is a p-type FinFET, the work-function metal has a high work function, which is higher than the mid-gap work function. The work function of the respective work-function metal may be referred to as a p-work function, which is higher than about 4.5 eV, and may be in the range between about 4.7 eV and about 5.1 eV.

In the description that follows, examples are provided assuming a first fin $210_A$ (see, e.g., FIG. 20B) is formed having three work function layers and a second fin 210$_B$ (see, e.g., FIG. 20B) is formed having one work function layer. In this example, the first fin 210$_A$ is assumed to be a p-type FinFET and the second fin 210$_B$ is assumed to be a n-type FinFET. Three work function layers will be formed over the first fin 210$_A$ for the p-type FinFET and one work function layer will be formed over the second fin 210$_B$ for the n-type FinFET. The three work function layers may be, for example, two layers of p-type work function metals (such as TiN or other p-type work function metals) and one layer of an n-type work function metal (such as TiAl or other n-type work function metals), whereas the one layer of the n-type work function metal will be used over the second fin 210$_B$ of the n-type FinFET.

As another example, the first fin 210$_A$ may be part of an n-type FinFET and the second fin 210$_B$ may be part of a p-type FinFET. In this example, the three work function layers over the first fin 210$_A$ may be, for example, two layers of n-type work function metals (such as TiAl or other n-type work function metals) and one layer of a p-type work function metal (such as TiN or other p-type work function metals), whereas the one layer of the p-type work function metal will be used over the second fin 210$_B$ of the p-type FinFET. Other materials, processes, and configurations may be utilized within the scope of the present disclosure.

Figure 20A:
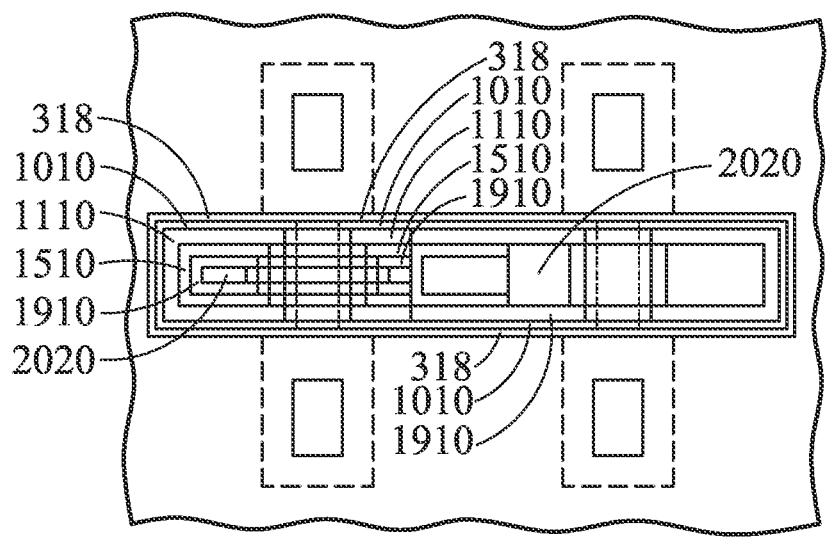
Figure 20B:
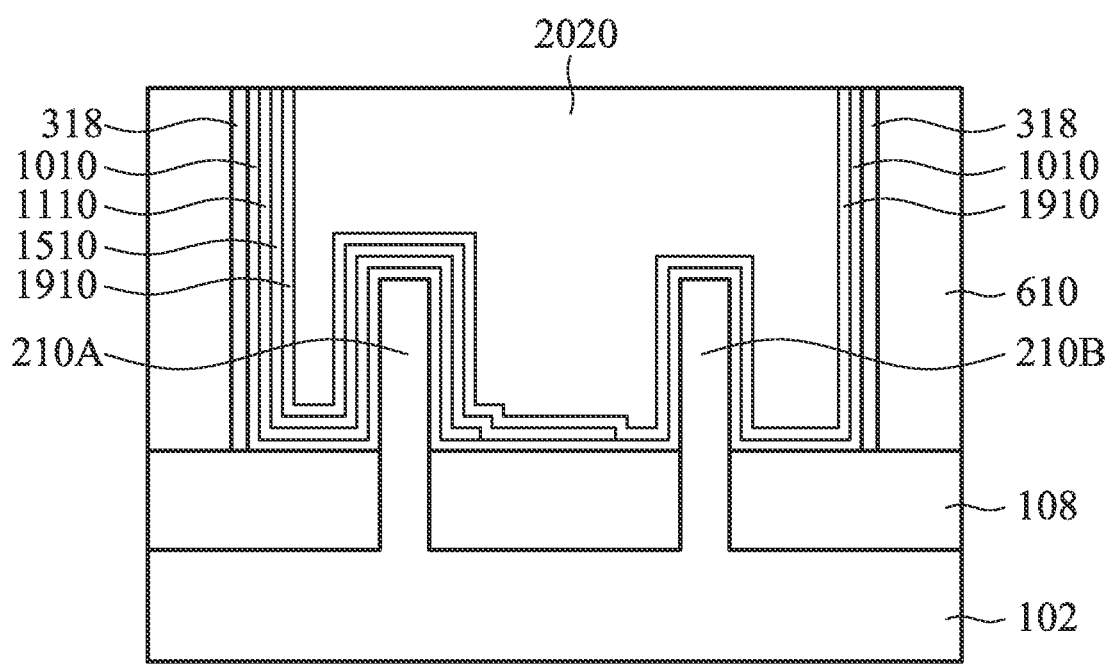
Figure 21:
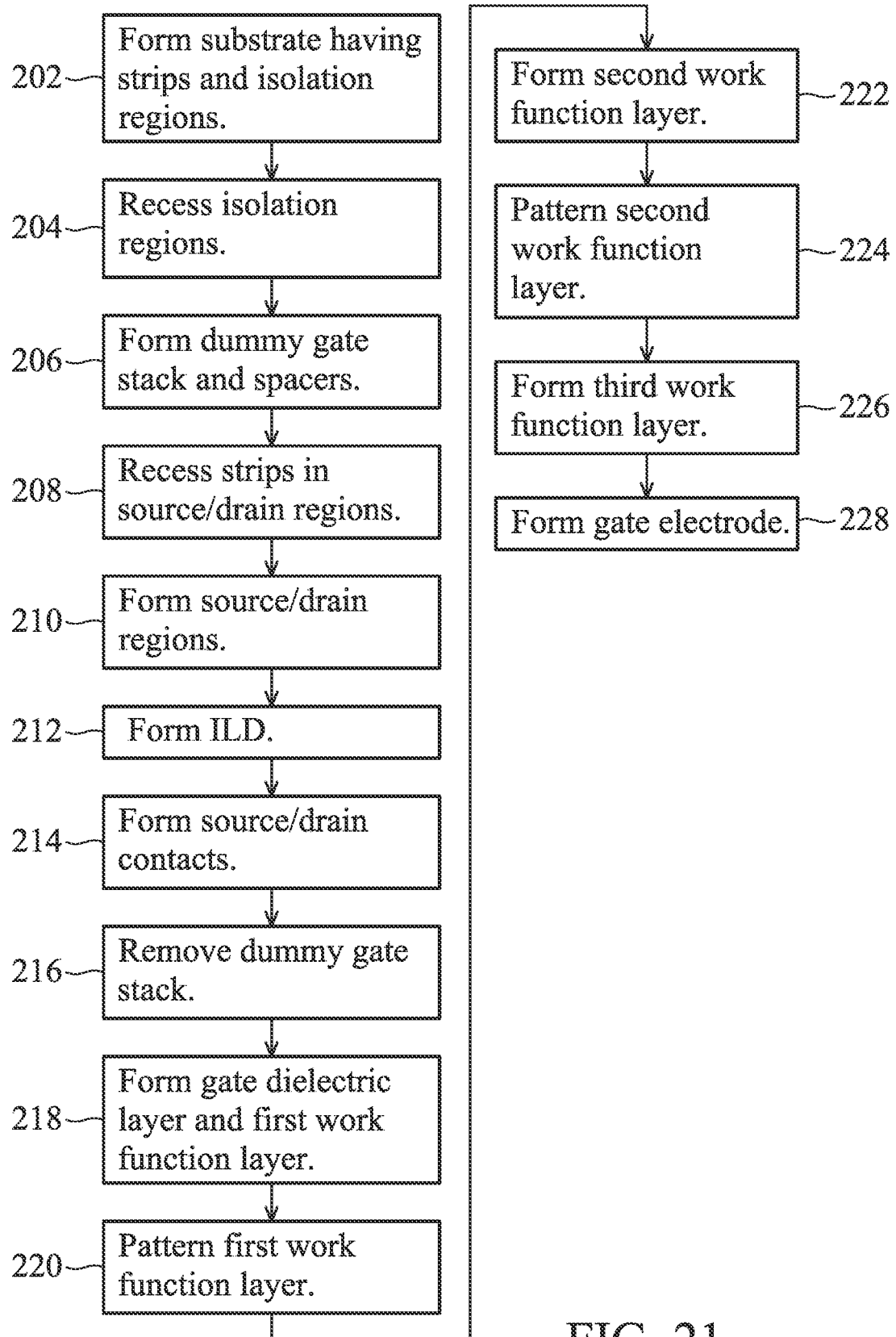
FIG. 21 illustrates a flow chart of a process for forming a FinFET in accordance with some embodiments.

The steps shown in FIGS. 1 through 20B are also reflected schematically in the process flow shown in FIG. 21.

FIG. 1 illustrates a perspective view of an initial structure. The initial structure includes a substrate 102 having semiconductor strips 106 extending therefrom. The respective step is illustrated as step 202 in the process flow shown in FIG. 21. The substrate 102 is formed of a semiconductor material having a first lattice constant. As will be explained in greater detail below, another semiconductor layer having a second lattice constant, different than the first lattice constant, will be formed over material of the substrate 102. In some embodiments, the substrate 102 comprises a crystalline silicon substrate (e.g., wafer), although other suitable elemental semiconductor, such as a suitable compound semiconductor (e.g., gallium arsenide, silicon carbide, indium arsenide, indium phosphide, or the like), or a suitable alloy semiconductor (e.g., silicon germanium carbide, gallium arsenic phosphide, or gallium indium phosphide), or the like, may also be used. Further, the substrate 102 may include an epitaxial layer (epi-layer), may be strained for performance enhancement, and/or may include a silicon-on-insulator (SOI) structure.

Furthermore, the substrate 102 may include other features. For example, the substrate may include various doped regions depending on design requirements (e.g., p-type substrate or n-type substrate). For example, the doped regions may be doped with p-type dopants, such as boron or BF$_2$, n-type dopants, such as phosphorus or arsenic, and/or combinations thereof. The doped regions may be configured for an n-type FinFET and/or a p-type FinFET.

The substrate 102 may be patterned using, for example, photolithography techniques. For example, a mask layer (not shown), such as a pad oxide layer and an overlying pad nitride layer, is formed over the substrate 102. The pad oxides layer may be a thin film comprising silicon oxide formed, for example, using a thermal oxidation process. The pad oxide layer may act as an adhesion layer between the substrate 102 and the overlying pad nitride layer and may act as an etch stop layer for etching the pad nitride layer. In an embodiment, the pad nitride layer is formed of silicon nitride, for example, using low-pressure chemical vapor deposition (LPCVD) or plasma enhanced chemical vapor deposition (PECVD).

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is patterned to define the pad oxide and pad nitride.

The patterned mask is subsequently used to pattern exposed portions of the substrate 102 to form trenches 104, thereby defining semiconductor strips 106 between adjacent trenches 104 as illustrated in FIG. 1. As will be discussed below, the trenches 104 will be subsequently filled with a dielectric material, forming isolation regions such as shallow trench isolation (STI) regions adjacent to the semiconductor strips 106. In some embodiments, the trenches 104 may be strips (viewed from in the top) parallel to each other, and closely spaced with respect to each other. In some embodiments, the trenches 104 may be continuous and surrounding the semiconductor strips 106.

Isolation regions, such as STI regions 108, may be formed to extend from a top surface of substrate 102 into substrate 102, wherein the top surface of substrate 102 is a major surface 102A of the substrate or wafer. The portions of substrate 102 between neighboring STI regions 108 are referred to as semiconductor strips 106. The top surfaces of semiconductor strips 106 and the top surfaces of STI regions 108 may be substantially level (within process variations) with each other in accordance with some exemplary embodiments.

STI regions 108 may include a liner oxide (not shown). The liner oxide may be formed of a thermal oxide formed through a thermal oxidation of a surface layer of substrate 102. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 108 may also include a dielectric material over the liner oxide, wherein the dielectric material may be formed of Flowable Chemical Vapor Deposition (FCVD), spin-on, or the like.

In some embodiments, the STI regions 108 may be a silicon oxide layer formed using an HDPCVD process, using silane (SiH$_4$) and oxygen (O$_2$) as reacting precursors. In other embodiment, the STI regions 108 may be formed using a sub-atmospheric CVD (SACVD) process or high aspect-ratio process (HARP), wherein process gases may comprise tetraethylorthosilicate (TEOS) and ozone (O$_3$). In yet other embodiments, the STI regions 108 may be formed using a spin-on-dielectric (SOD) process, such as hydrogen silsesquioxane (HSQ) or methyl silsesquioxane (MSQ). Other processes and materials may be used. A planarization process, such as a chemical mechanical polish (CMP) process, may be performed to remove excess materials to form the STI regions 108 as illustrated in FIG. 1.

Figure 2:
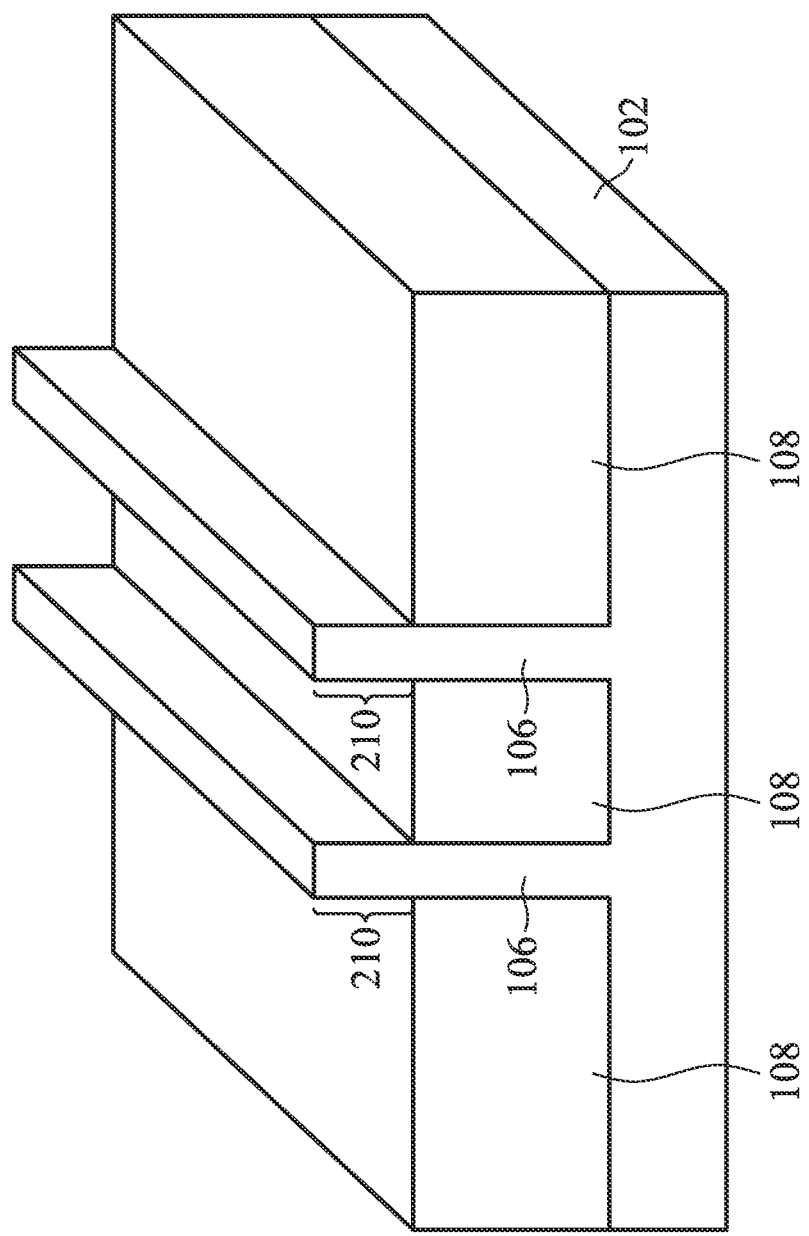

Referring to FIG. 2, STI regions 108 are recessed, so that top portions of semiconductor strips 106 protrude higher than the top surfaces of STI regions 108 to form protruding fins 210. The respective step is illustrated as step 204 in the process flow shown in FIG. 21. The etching may be performed using one or more etching processes. For example, a dry etching process using NF$_3$ and NH$_3$ as the etching gases may be used in embodiments in which the STI regions 108 are formed of silicon oxide. Argon may also be included. In accordance with alternative embodiments of the present disclosure, the recessing of STI regions 108 may be performed using a wet etch process, such as a diluted HF wet etch.

Figure 3:
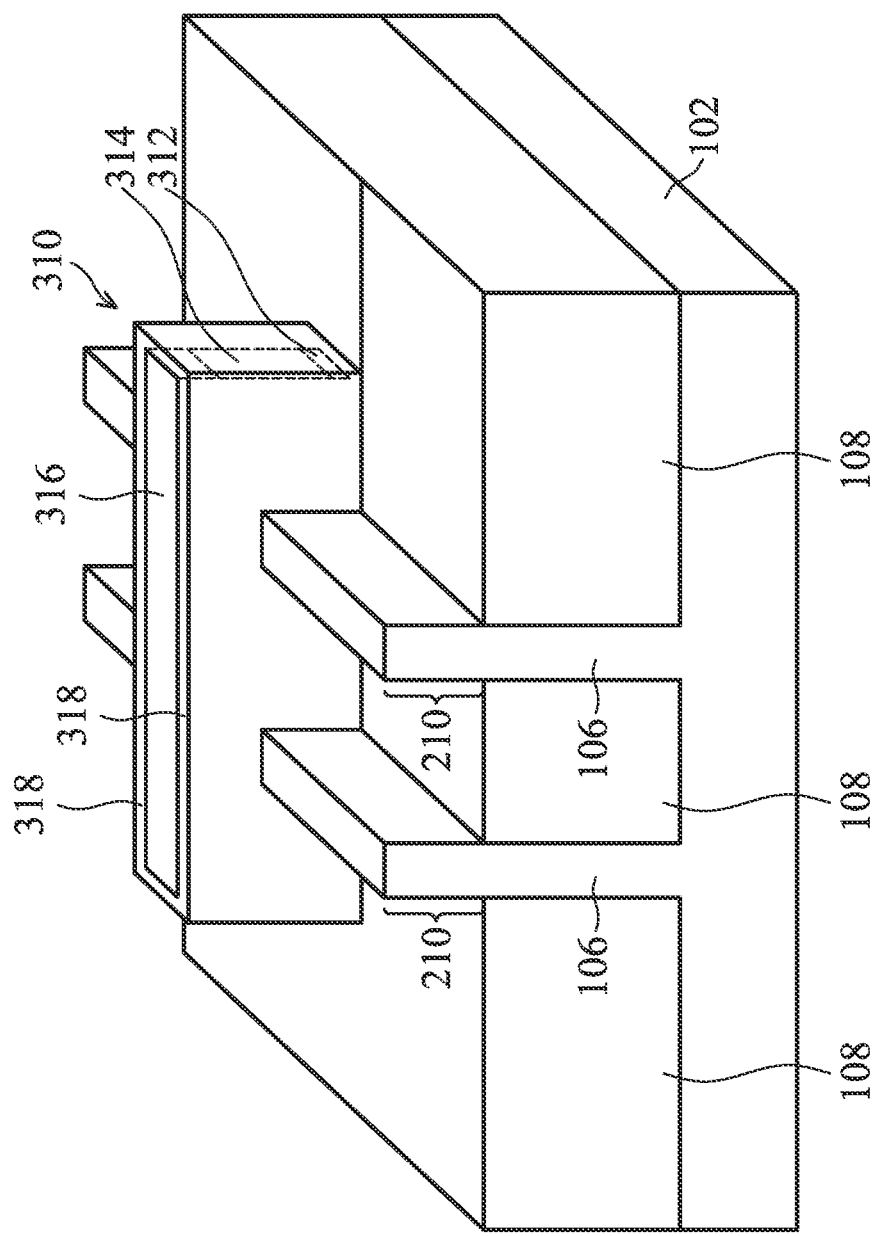

Referring to FIG. 3, dummy gate stack 310 is formed on the top surfaces and the sidewalls of protruding fins 210. The respective step is illustrated as step 206 in the process flow shown in FIG. 21. Dummy gate stack 310 may include dummy gate dielectric 312 and dummy gate electrode 314 over dummy gate dielectric 312. Dummy gate electrode 314 may be formed, for example, using polysilicon, but other materials may also be used. Dummy gate stack 310 may also include one or more hard masks, such as hard mask 316, over dummy gate electrode 314. Hard mask layer 316 may be formed of silicon nitride, silicon carbo-nitride, or the like. Dummy gate stack 310 may also have a lengthwise direction substantially perpendicular (e.g., within process variations) to the lengthwise or longitudinal direction of protruding fins 210.

Next, gate spacers 318 are formed on the sidewalls of dummy gate stack 310. In accordance with some embodiments of the present disclosure, gate spacers 318 are formed of a dielectric material such as silicon nitride, silicon oxy-carbo-nitride (SiOCN), silicon carbon-nitride (SiCN), or a metal oxide such as aluminum oxide. In accordance with some embodiments of the present disclosure, spacer layer is formed of SiOCN, and may have a single-layer structure. In accordance with alternative embodiments, spacer layer has a composite structure including a plurality of layers. For example, spacer layer may include a silicon oxide layer, and a silicon nitride layer over the silicon oxide layer.

The gate spacers 318 may be formed by anisotropically etching a blanket-deposited layer. In accordance with some embodiments of the present disclosure, a spacer layer (not shown) is formed using a conformal deposition method such as ALD, CVD, etc., so that the sidewall portions of spacer layer have an adequate thickness. The horizontal portions and vertical portions of spacer layer may have substantially the same thickness, for example, with the vertical thickness of the vertical portions and the horizontal thickness of the horizontal portions having a difference smaller than 20 percent of the horizontal thickness.

An anisotropic etching is performed to remove the horizontal portions of spacer layer. The remaining vertical portions of spacer layer form gate spacers 318 on the sidewalls of dummy gate stack 310. Though not shown, portions of the spacer layer may remain adjacent to the protruding fins 210.

Figure 4:
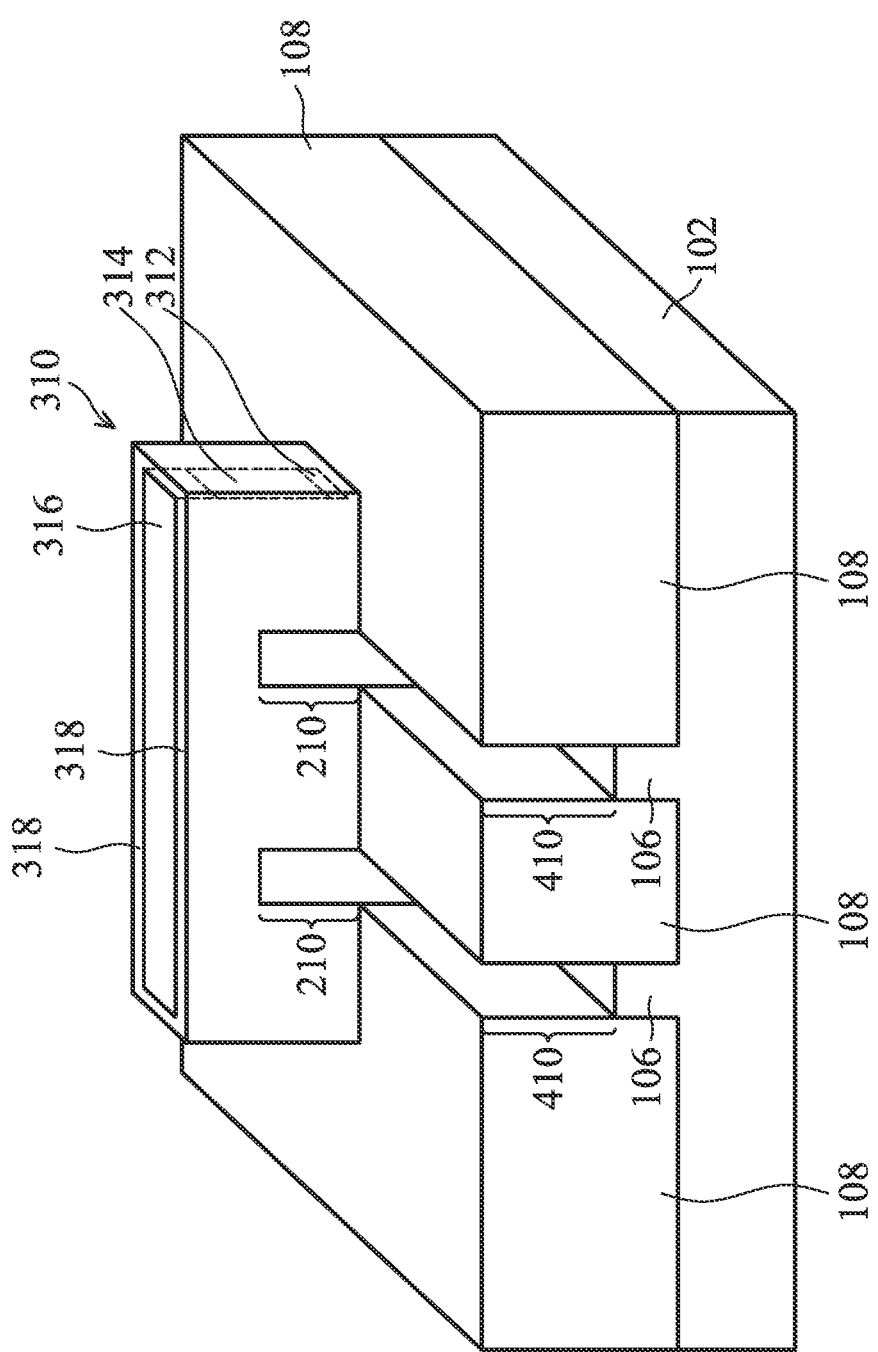

As illustrated in FIG. 4, an etching step (referred to as source/drain recessing hereinafter) is then performed to etch portions of protruding fins 210 that are not covered by dummy gate stack 310 and dummy gate spacers 318 in accordance with some embodiments. The respective step is illustrated as step 208 in the process flow shown in FIG. 21. The recessing may be anisotropic, and hence the portions of fins 210 directly underlying dummy gate stack 310 and dummy gate spacers 318 are protected and are not etched. The top surfaces of the recessed semiconductor strips 106 may be lower than the top surfaces of STI regions 108 in accordance with some embodiments. Recesses 410 are accordingly formed between STI regions 108. Recesses 410 are located on opposite sides of dummy gate stack 310.

Figure 5:
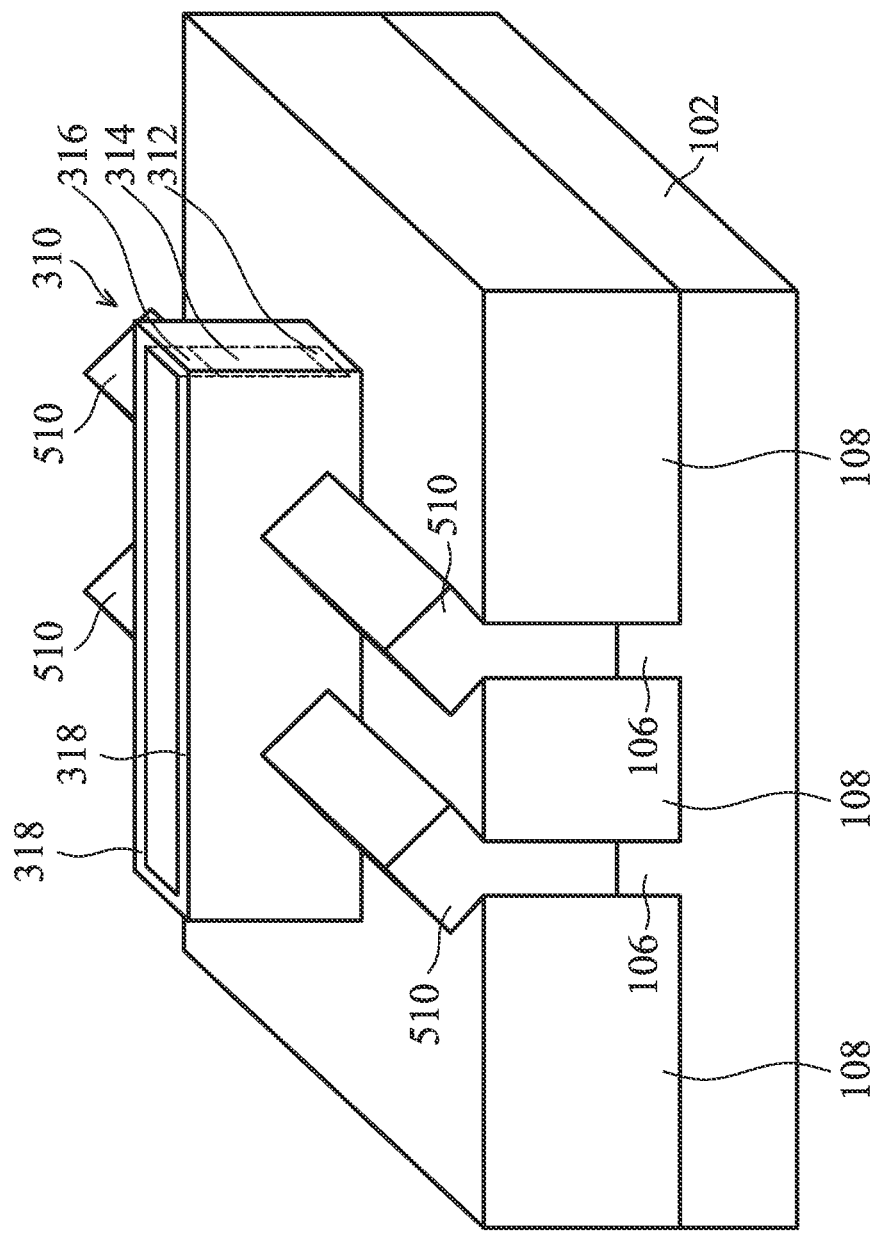

Next, as illustrated in FIG. 5, source/drain regions 510 are formed. The source/drain regions may be formed using an epitaxial process to selectively grow a semiconductor material in recesses 410 (see FIG. 4). The respective step is illustrated as step 210 in the process flow shown in FIG. 21. In accordance with some exemplary embodiments, source/drain regions 510 include silicon germanium or silicon. Depending on whether the resulting FinFET is a p-type FinFET or an n-type FinFET, the epitaxy regions may be in situ doped with a p-type or an n-type impurity. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions comprise III-V compound semiconductors such as GaAs, InP, GaN, InGaAs, InAlAs, GaSb, AlSb, AlAs, AlP, GaP, combinations thereof, or multi-layers thereof. After recesses 410 are filled with epitaxy regions, the further epitaxial growth of epitaxy regions causes epitaxy regions to expand horizontally, and facets may be formed.

After the epitaxy step, epitaxy regions may be further implanted with a p-type or an n-type impurity to form source/drain regions 510. In accordance with alternative embodiments of the present disclosure, the epitaxy regions are in-situ doped with the p-type or n-type impurity during the epitaxy process, and the implantation step is skipped. Epitaxy regions include lower portions that are formed in STI regions 108, and upper portions that are formed over the top surfaces of STI regions 108. Lower portions, whose sidewalls are shaped by the shapes of recesses 410 (FIG. 4), may have (substantially) straight edges, which may also be substantial vertical edges that are substantially perpendicular to the major surfaces of substrate 102.

Figure 6:
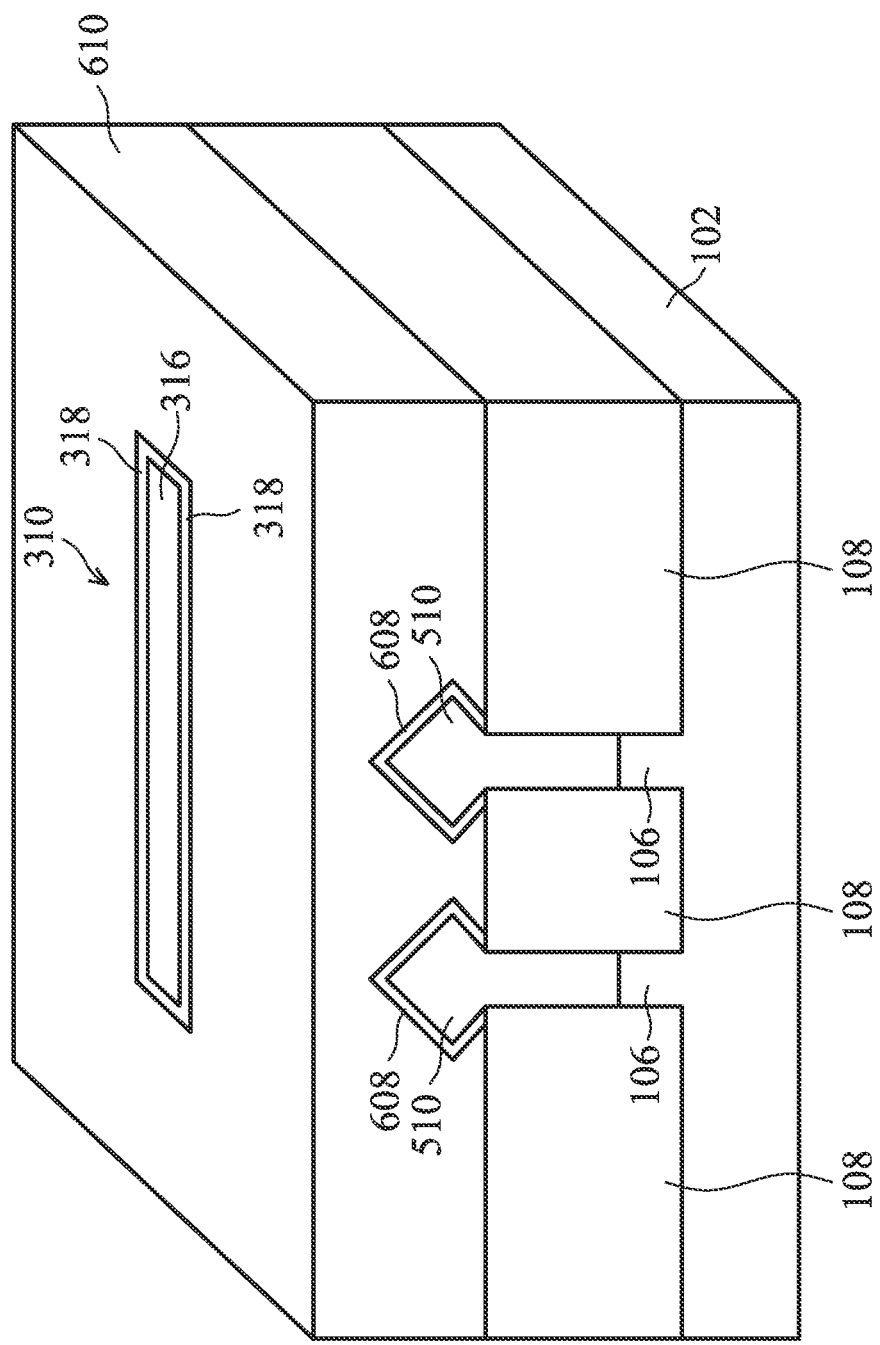

FIG. 6 illustrates a perspective view of the structure after silicide regions 608 and an Inter-Layer Dielectric (ILD) 610 are formed. The respective step is illustrated as step 212 in the process flow shown in FIG. 21. Source/drain silicide regions 608 are formed on the surfaces of source/drain regions 510. The formation process includes depositing a metal layer on the source/drain regions 510, and performing an anneal to react the metal layer with the exposed surface portions of epitaxy regions, so that silicide regions 608 are formed.

The ILD 610 may comprise a single layer or multiple layers. For example, in some embodiments an ILD liner (not shown) is deposited, and an ILD filler material is deposited over the ILD liner. In some embodiments, the ILD liner comprises $SiO_2$, SiCN, SiON, $Si_3N_4$, and $SiN_xH_y$, but other suitable dielectric materials may be used. The ILD liner may further comprise a plurality of layers that comprise combinations of the above mentioned materials. The ILD liner may be deposited through one or more processes such as PVD, CVD, or ALD, although any acceptable process may be utilized. Other materials and/or processes may be used.

In some embodiments, the ILD filler material comprises $SiO_2$, SiCN, SiOC, SiON, $Si_3N_4$, and $SiN_xH_y$, but other suitable dielectric film may be used. The isolation dielectric may be cured or treated after deposition. For example, the curing may involve irradiation with ultra-violet radiation, and the treatment may involve annealing in $N_2$, $O_2$, or $H_2O$ ambient at temperatures ranging above 200° C. After the curing or treatment, the isolation dielectric may have a relative permittivity of less than 6, such as less than 5, and such as less than 4. For example, the isolation dielectric may be $SiO_2$ formed by CVD, PECVD or ALD deposition process, FCVD, or a spin-on-glass process. A planarization process, such as a CMP process, may be performed to remove excess materials and to expose dummy gate stack 310.

Figure 7:
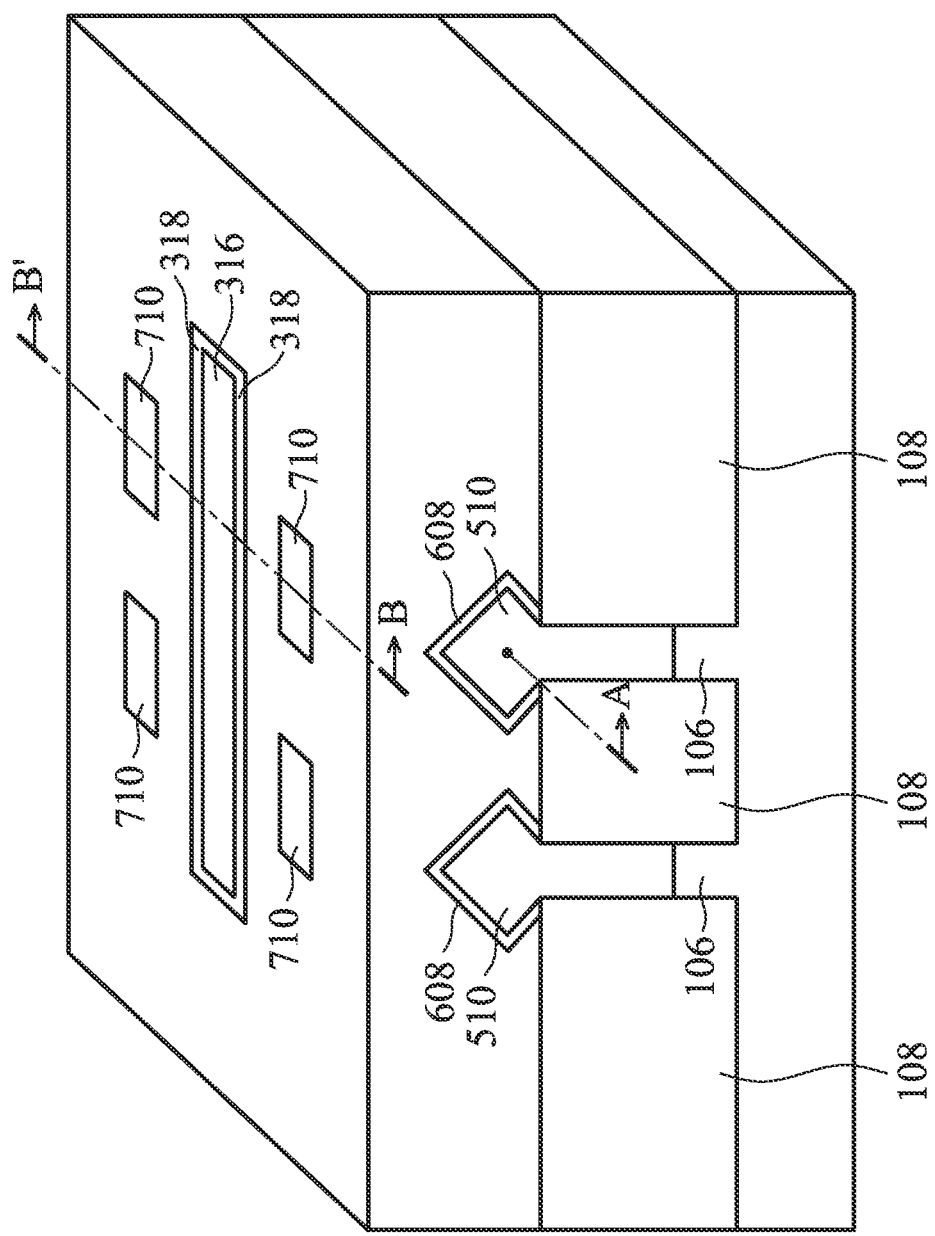

As illustrated in FIG. 7, portions of the ILD 610 are removed to form source/drain contacts 710. The respective step is illustrated as step 214 in the process flow shown in FIG. 21. The ILD 610 may be patterned to form openings to expose the source/drain regions 510/silicide regions 608 using photolithography processes in combination with one or more etching processes. In embodiments in which the ILD 610 is formed of silicon oxide, the etch process may be, for example, a dry etch, a chemical etch, or a wet cleaning process. For example, the chemical etch may employ fluorine-containing chemical such as dilute hydrofluoric (dHF) acid. Other materials and/or processes may be used.

Thereafter, the openings may be filled with one or more conductive layers to form the source/drain contacts 710. The source/drain contacts 710 may comprise a single layer or a multi-layer structure. For example, in some embodiments the source/drain contacts 710 comprise a liner, such as a diffusion barrier layer, an adhesion layer, or the like, and a contact filler formed over the contact liner in the openings. The contact liner may include Ti, TiN, Ta, TaN, or the like formed by ALD, CVD, or the like. The contact filler may be formed by depositing a conductive material, such as one or more layers of Ni, Ta, TaN, W, Co, Ti, TiN, Al, Cu, Au, alloys thereof, combinations thereof, or the like, but other suitable metal may be used. A planarization process, such as a CMP, may be performed to remove excess material from a surface of the ILD 610, thereby forming the contacts as illustrated in FIG. 7.

The above process generally describes a FinFET structure and a method of forming for illustration purposes. Other structures and processes may be used. For example, multiple epitaxial regions and different fin/epitaxial shapes may be used. Additionally, while the structure and the figures described above illustrate a single fin for each of the source/drain regions, multiple fins may share a common source/drain region, in which the epitaxial regions are separated or grown together. The epitaxial regions grown together may have faceted upper surfaces or relatively flat upper surfaces, and may include voids between the epitaxial regions and the ILD. As another example, different or additional spacer structures, masks, liners, and the like may be used.

As will be described in greater detail below with reference to FIGS. 8A-20B, the dummy gate stack 310 will be replaced with a metal gate structure, whereas the "A" labeled figures are plan views of the area around the dummy gate stack 310 as illustrated in FIG. 7, and the "B" labeled figures are taken along the B-B' cross section illustrated in FIG. 7. Moreover, one or more work function layers will be formed over each of the fins 210, such that the work function layers are adjusted for the particular desired electrical characteristics of each transistor. For example, in some situations in a PMOS transistor and an NMOS transistor may have a shared gate, such as for an inverter, but the work function layers of the NMOS transistor may be tuned independently of the PMOS transistor to increase performance of each transistor. As such, the following discussion describes a device and a method of manufacturing a device in which two transistors share a common gate, but have different work function layers.

Figure 8A:
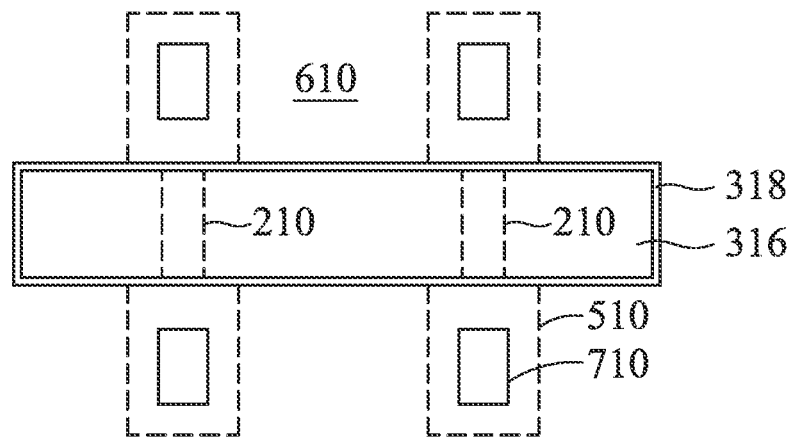
Figure 8B:
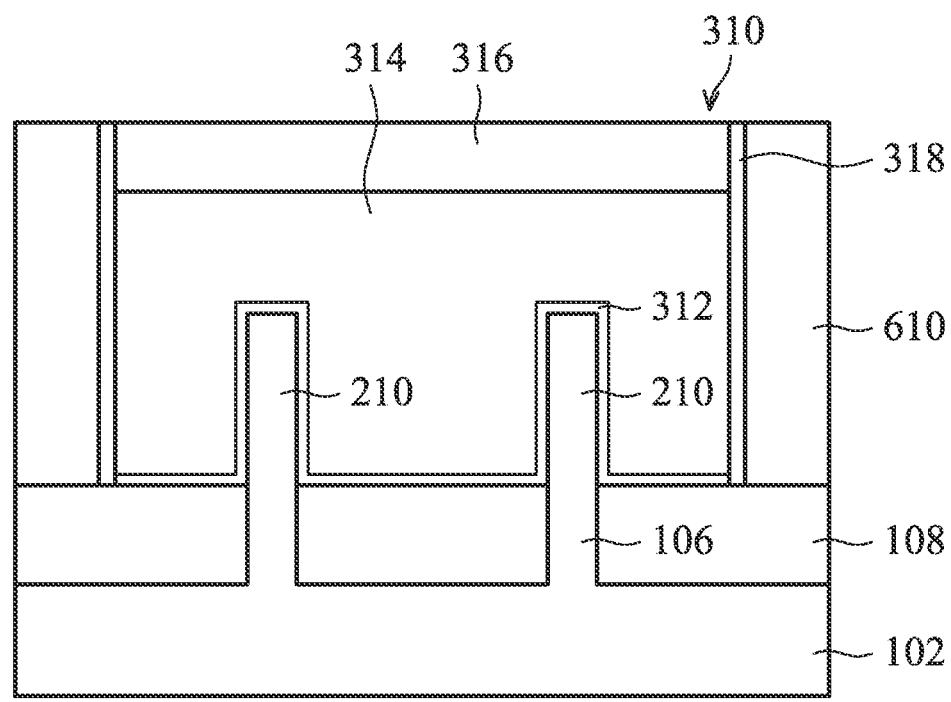

Referring first to FIGS. 8A and 8B, there is shown for reference the plan view and cross-sectional view, respectively, of the structure illustrated in FIG. 7 for reference prior to proceeding further with processing.

Figure 9A:
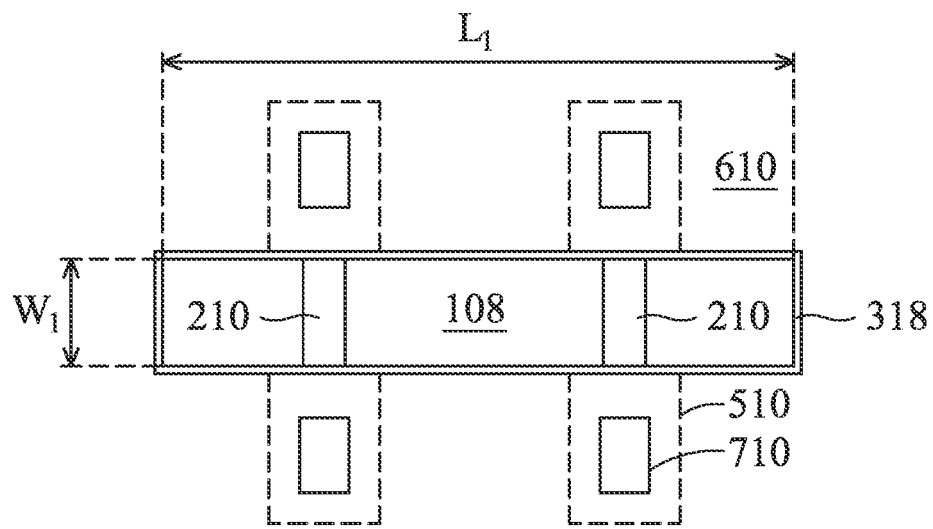
Figure 9B:
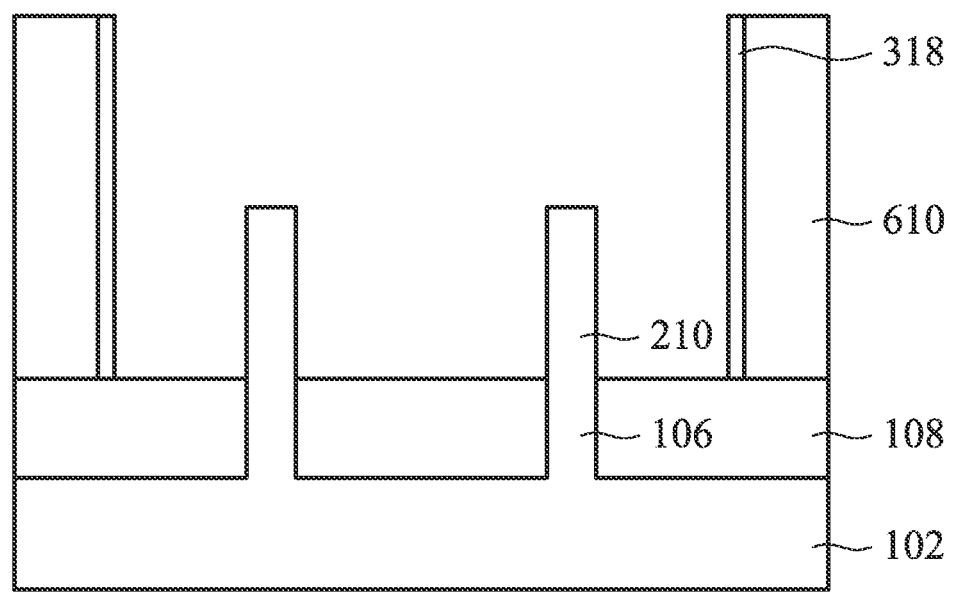

Thereafter, as illustrated in FIGS. 9A and 9B, the dummy gate stack 310 (see FIGS. 8A and 8B), including hard mask layer 316, dummy gate electrode 314, and dummy gate dielectric 312, are removed, thereby forming a recess 910. The respective step is illustrated as step 216 in the process flow shown in FIG. 21. The removal process may comprise one or more etch processes. For example in embodiments in which the ILD 610 comprises silicon oxide, the hard mask 316 comprises silicon nitride, the dummy gate electrode 314 comprises polysilicon, and the dummy gate dielectric 312 comprises silicon oxide, the removal process may comprise selectively etching using either dry or wet etching. In this example, the hard mask layer 316 may be removed by using a dry etch with a process gas including $CF_4$, $CHF_3$, $CH_2F_2$, $CH_3F$, $NF_3$, $SF_6$, or combinations thereof, and the dummy gate electrode 314 may be removed using a dry etch with a process gas including $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used to remove the dummy gate electrode 314, the chemicals may include $NH_4OH:H_2O_2:H_2O$ (APM), $NH_2OH$, KOH, $HNO_3$:$NH_4F$:$H_2O$, and/or the like. The dummy gate dielectric 312 may be removed using a wet etch process, such as a diluted HF acid. Other processes and materials may be used. In some embodiments, the recess 910 may have a width W1 of about 10 nm to about 300 nm, and a length L1 of about 100 nm to about 2000 nm.

Figure 10A:
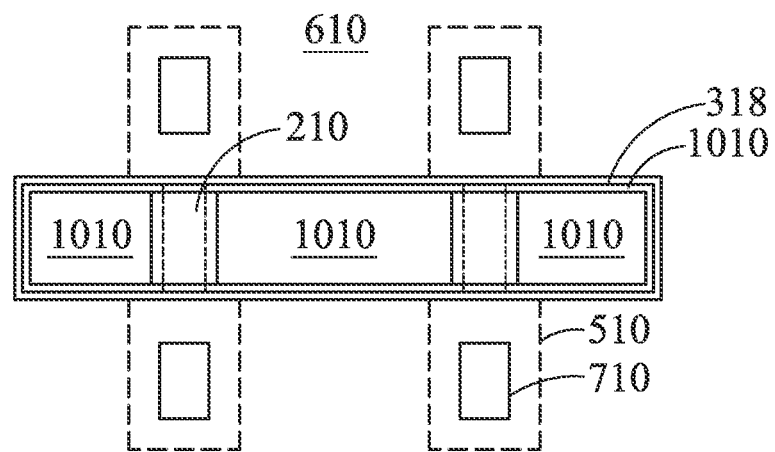
Figure 10B:
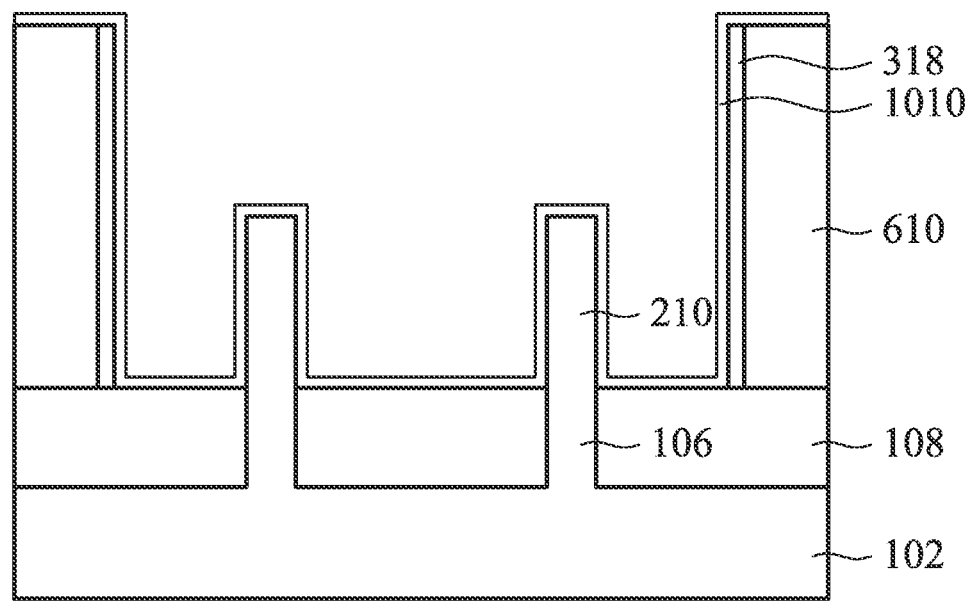

Next, referring to FIGS. 10A and 10B, one or more gate dielectric layers 1010 is formed over a channel region of the fins 210 in accordance with some embodiments. The respective step is illustrated as step 218 in the process flow shown in FIG. 21. In an embodiment, the gate dielectric layer 1010 includes one or more high-k dielectric layers (e.g., having a dielectric constant greater than 3.9) and may be formed as a conformal layer extending along the sidewalls of protruding fins 210 and the top surface and the sidewalls of gate spacers 318 and the ILD 610. (The gate dielectric layers 1010 are not illustrated over the gate spacers 318 and the ILD 610 in the plan view of the "A" figures for ease of illustration.) For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, $Si_3N_4$, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 1010 include molecular-beam deposition (MBD), ALD, PVD, and the like. In an embodiment, the gate dielectric layer 1010 may have a thickness of about 10 Å to about 25 Å.

In some embodiments, an interfacial layer (not shown) may be formed over the channel region of the fins 210 prior to forming the gate dielectric layer 1010, and the gate dielectric layer 1010 is formed over the interfacial layer. The interfacial layer helps buffer the subsequently formed high-k dielectric layer from the underlying semiconductor material. In some embodiments, the interfacial layer is a chemical silicon oxide, which may be formed of chemical reactions. For example, a chemical oxide may be formed using deionized water+ozone ($DIO_3$), $NH_4OH+H_2O_2+H_2O$ (APM), or other methods. Other embodiments may utilize a different material or processes (e.g., a thermal oxidation or a deposition process) for the interfacial layer. In an embodiment, the interfacial layer may have a thickness of about 3 Å to about 7 Å. The interfacial layer and/or the gate dielectric layers 1010 may extend only over the fin 210 (e.g., not over the STI regions 108, the gate spacers 318, or the ILD 610), depending on the material and the processes used to form those layers.

Figure 11A:
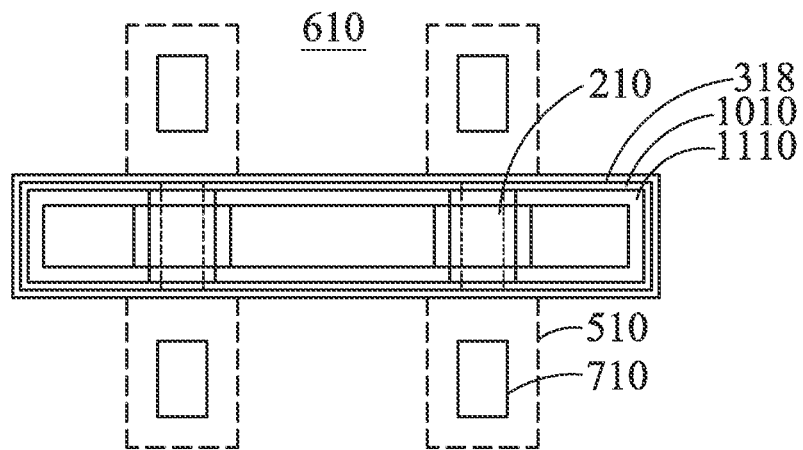
Figure 11B:
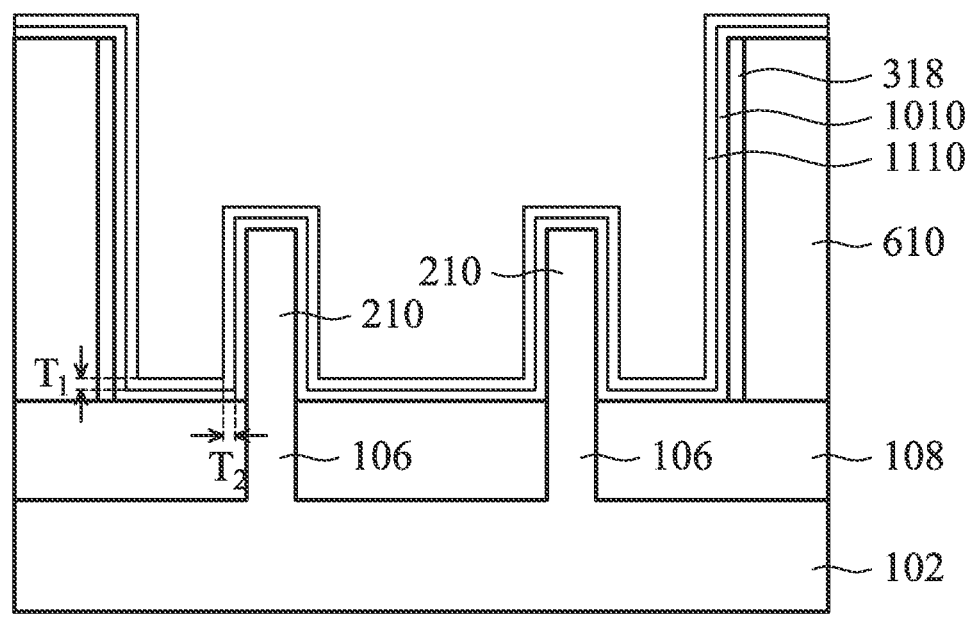

Thereafter, as illustrated in FIGS. 11A and 11B, a first work function (WF) layer 1110 is formed over the fins 210. The respective step is illustrated as step 218 in the process flow shown in FIG. 21. As will be described in greater detail below, a work function structure comprising one or more metal layers will be formed over the fins 210, wherein the work function metal will be patterned for each particular transistor. The work function of the gate electrode may be adjusted to the band-edge of silicon or other underlying semiconductor material. For an NMOS device, the work function may be adjusted to close to the conduction band of silicon, and for a PMOS device, the work function may be adjusted to close to the valence band of silicon, to increase the performance of the transistors.

In an embodiment, the first work function layer 1110 is formed through deposition, such as a conformal deposition method such as ALD or CVD, so that the horizontal thickness $T_1$ of the horizontal portions and vertical thickness $T_2$ of vertical portions have thicknesses substantially equal to each other. For example, horizontal thickness $T_1$ and vertical thickness $T_2$ may have a difference smaller than about 20 percent or 10 percent of thickness $T_1$. The thickness $T_1$ may be in the range between about 5 Å and about 30 Å.

Figure 12A:
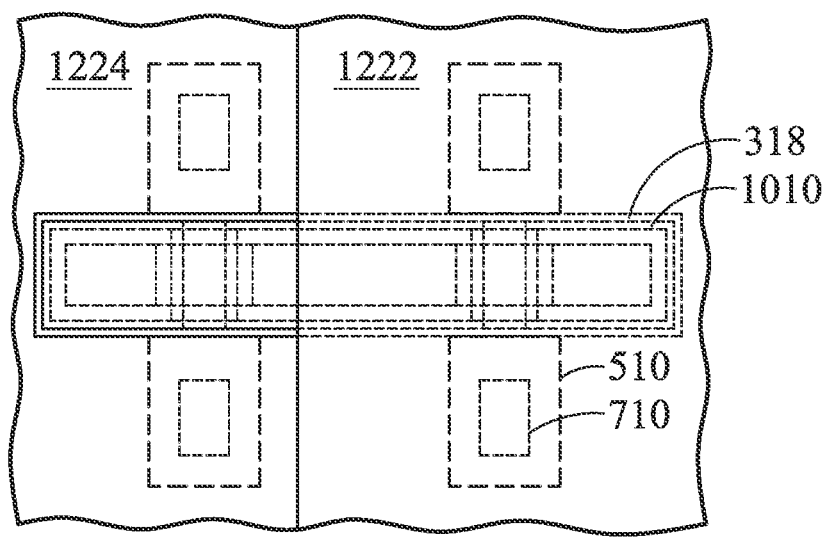
Figure 12B:
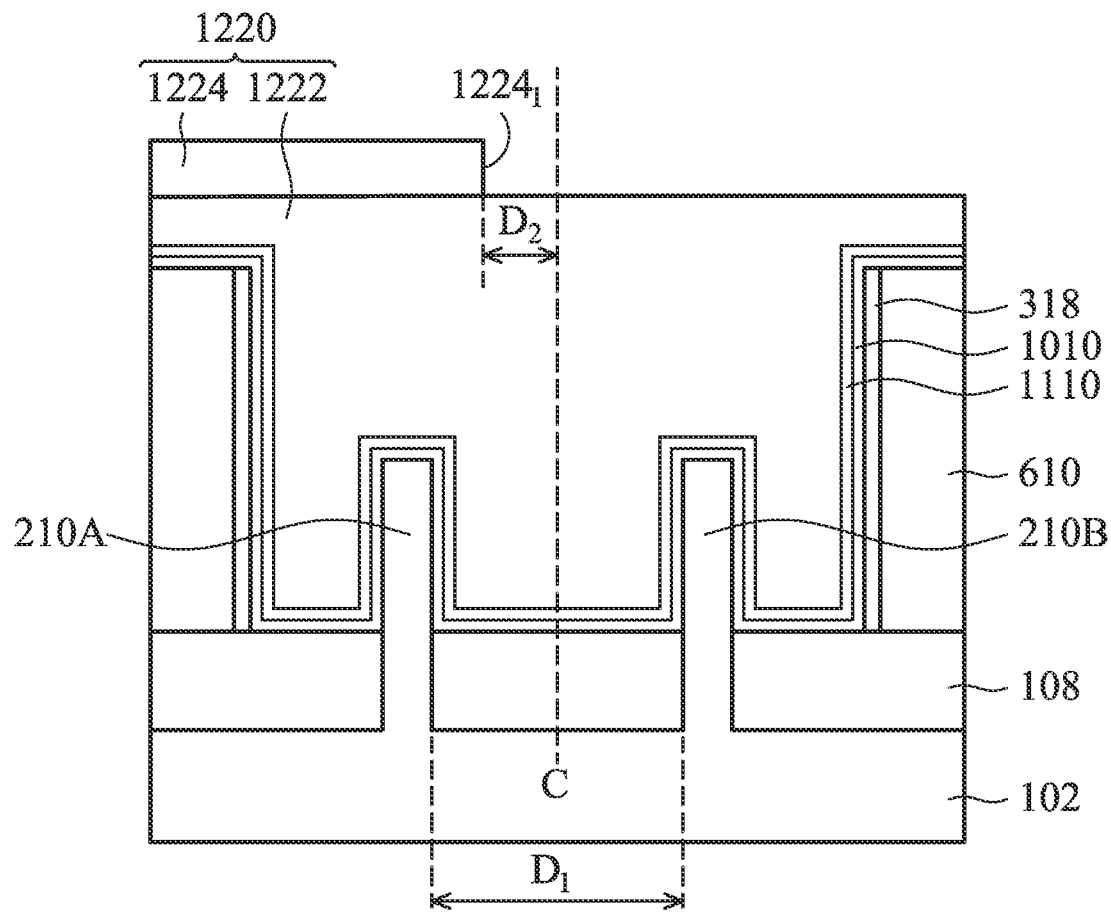

FIGS. 12A-12B illustrate formation of a first mask 1220 to subsequently pattern the first WF layer 1110 in accordance with some embodiments. The respective step is illustrated as step 220 in the process flow shown in FIG. 21. The first mask 1220 may comprise one or more layers of a masking material. For example, FIGS. 12A and 12B illustrate a first sacrificial layer 1222 formed over the first WF layer 1110. The first sacrificial layer 1222 may be formed of a bottom antireflective coating (BARC). Generally, during photolithography patterning, light may be reflected off the surface of the underlying material and back into the photoresist material during the exposure process, wherein the reflected light may alter the intended pattern of the photoresist. A BARC layer formed of a material having the appropriate refractive index n to limit or prevent reflection of the exposing light back into the photoresist material. In some embodiments, the first sacrificial layer 1222 may be formed of, for example, a dielectric, an organic material, or the like, and may be formed by, for example, spin coating, PECVD, CVD, or the like. In some embodiments, the first sacrificial layer 1222 may be a resist underlayer film as described in U.S. Pat. No. 8,481,247, which is incorporated herein by reference in its entirety. Additionally, the first mask 1220 may comprise one or more additional masking layers, such as the first patterned mask 1224. In some embodiments, the first patterned mask 1224 may be a photoresist exposed and developed to form the pattern as illustrated in FIGS. 12A and 12B. Additional masks, such as a silicon oxide, silicon nitride, combinations thereof, or the like may be used in addition to, or instead of, the photoresist mask to provide additional protections during etching.

As illustrated in FIGS. 12A and 12B, a first edge $1224_1$ of the first patterned mask 1224 is shifted from a center line C between the adjacent fins, indicated in the figures as a first fin $210_A$ and a second fin $210_B$, toward the first fin $210_A$ by a distance $D_2$. As discussed in greater detail below with reference to FIGS. 16A and 16B, shifting the first edge $1224_1$ of the first patterned mask 1224 toward the first fin $210_A$ allows subsequent masks to provide better coverage and provide more uniform patterning of subsequent WF layers.

In some embodiments, a distance $D_1$ between the first fin $210_A$ and the second fin $210_B$ is about 30 nm to about 100 nm, and a shift distance $D_2$ is between about 6 nm and about 40 nm. In some embodiments, the shift distance is about 20% to about 40% of the distance $D_1$ between the first fin $210_A$ and the second fin $210_B$.

Figure 13A:
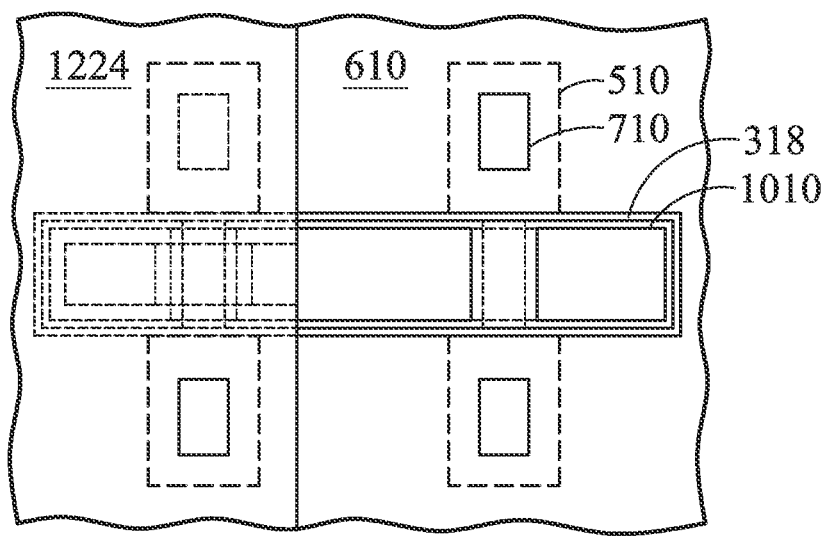
Figure 13B:
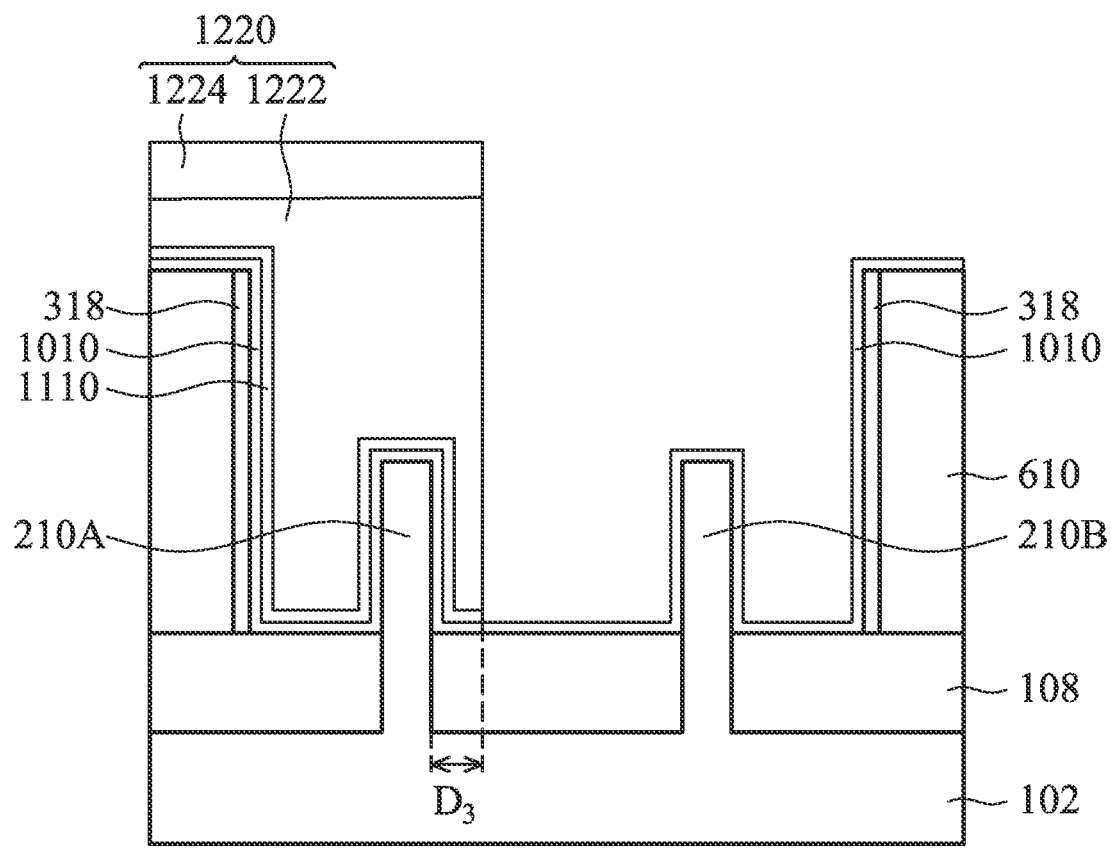

Next, as shown in FIGS. 13A and 13B, the first patterned mask 1224 is used as an etching mask to pattern the first sacrificial layer 1222 and the first work function layer 1110. The respective step is illustrated as step 220 in the process flow shown in FIG. 21. In embodiments in which the first sacrificial layer 1222 is formed of bottom antireflective coating, the first sacrificial layer 1222 may be etched using a dry etch process, or other suitable etching processes, may be used. In the case dry etching is used, the process gas may include $N_2$, $O_2$, $CH_4$, $CF_4$, $CHF_3$, $NF_3$, $SF_6$, $Br_2$, HBr, $Cl_2$, or combinations thereof. Diluting gases such as $N_2$, $O_2$, or Ar may optionally be used. In some embodiments, the sacrificial layer 1222 may be patterned as the resist underlayer film described in U.S. Pat. No. 8,481,247, which is incorporated herein by reference in its entirety. Thereafter, a wet etch process, or other suitable etching processes, may be used to pattern the underlying first work function layer 1110. For example, in embodiments in which the first work function layer 1110 is formed of TiN, a wet etching process using $NH_4OH+H_2O_2+H_2O$ (APM), and/or the like, may be used. Other processes and materials may be used.

Figure 14A:
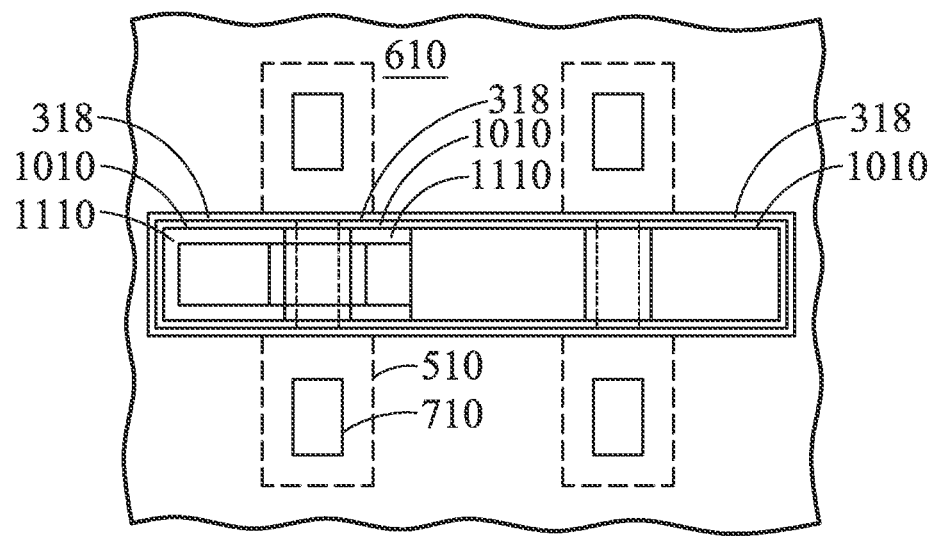
Figure 14B:
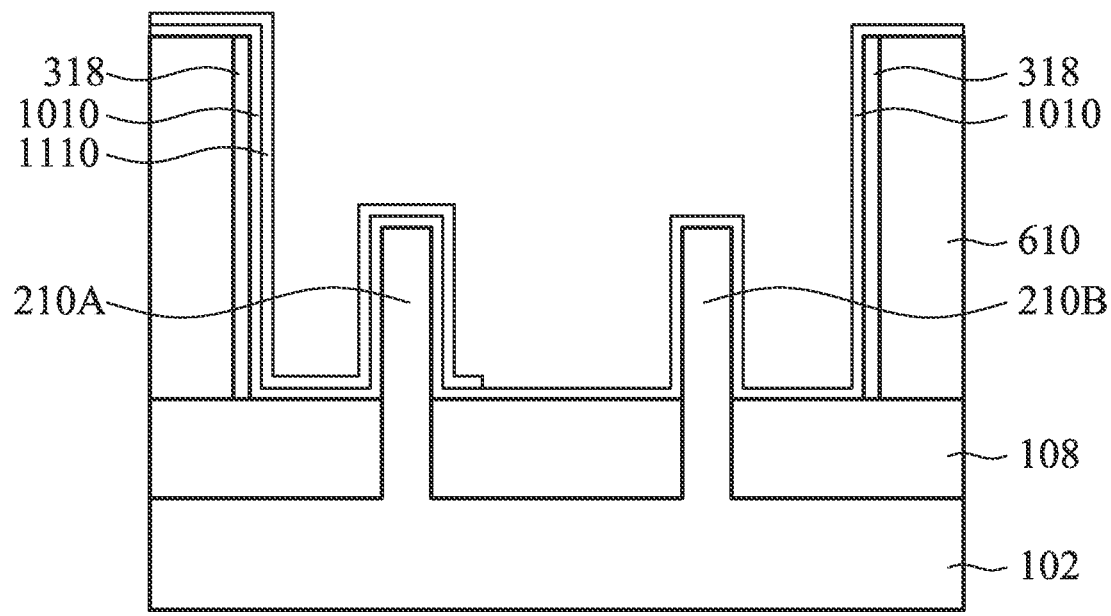

FIGS. 14A and 14B illustrate removal of the first patterned mask 1224 and the first sacrificial layer 1222. The respective step is illustrated as step 220 in the process flow shown in FIG. 21. In an embodiment in which the first patterned mask 1224 is formed of a patterned photoresist, the first patterned mask 1224 may be removed using an ashing process in an ambient of $N_2$, $H_2$, $O_2$ and a temperature of about 150° C. to about 350° C. In an embodiment in which the first sacrificial layer 1222 is formed of bottom antireflective coating, the first sacrificial layer 1222 may be removed using, for example, an ashing process in an ambient of $N_2$, $H_2$, $O_2$ and a temperature of about 150° C. to about 350° C. In some embodiments, an edge of the first work function layer 1010 extends a distance $D_3$ from the first fin $210_A$ as illustrated in FIG. 14B of about 10 nm to about 40 nm.

Figure 15A:
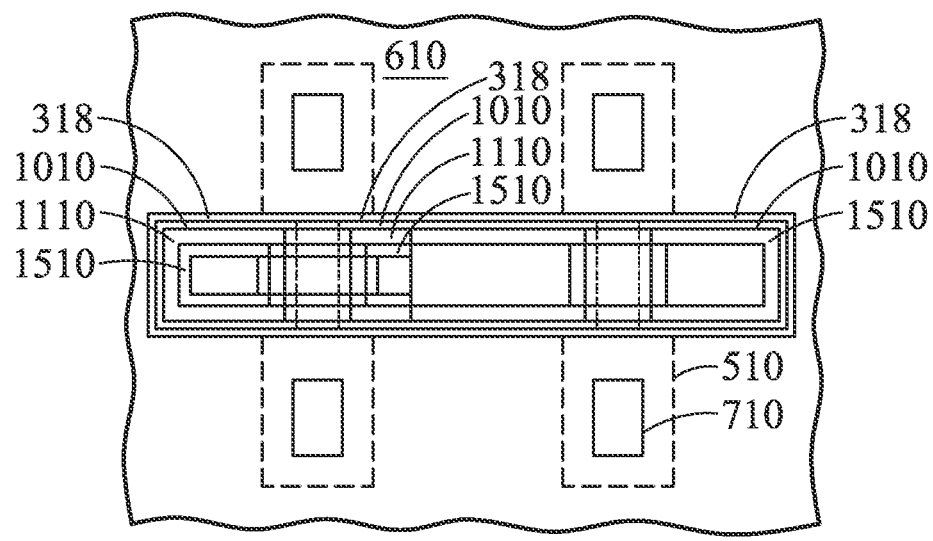
Figure 15B:
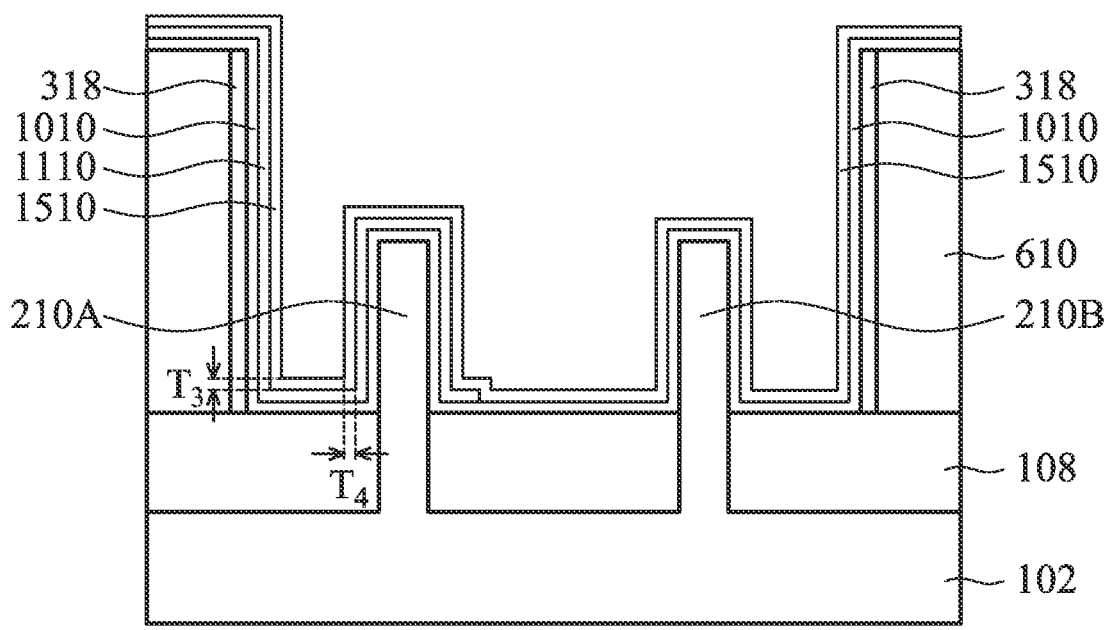

Thereafter, as illustrated in FIGS. 15A and 15B, a second WF layer 1510 is formed over the first WF layer 1110 in the area of the first fin $210_A$ and over the second fin $210_B$. The respective step is illustrated as step 222 in the process flow shown in FIG. 21. In an embodiment, the second WF layer 1510 is formed through deposition, such as a conformal deposition method such as ALD or CVD, so that the horizontal thickness $T_3$ of the horizontal portions and vertical thickness $T_4$ of vertical portions of second work function layer 1510 have thicknesses substantially equal to each other. For example, horizontal thickness $T_3$ and vertical thickness $T_4$ may have a difference smaller than about 20 percent or 10 percent of thickness $T_3$. The thickness $T_3$ may be in the range between about 5 Å and about 50 Å.

Figure 16A:
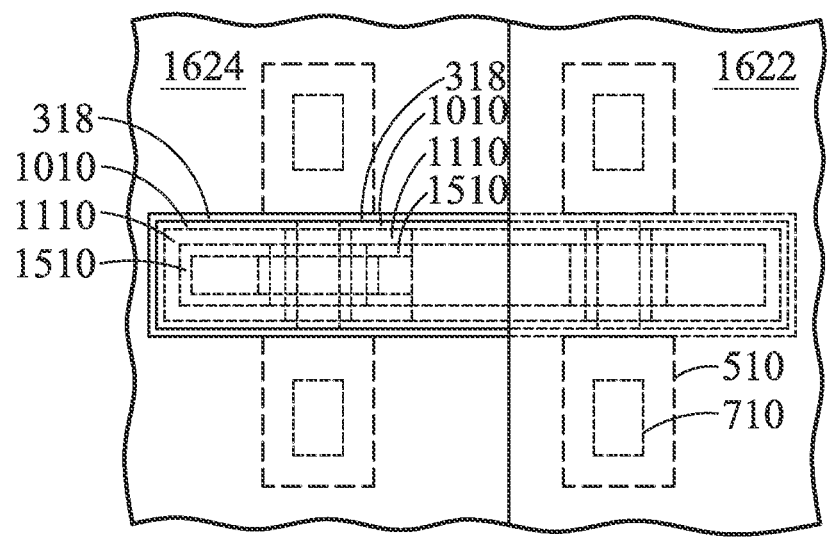
Figure 16B:
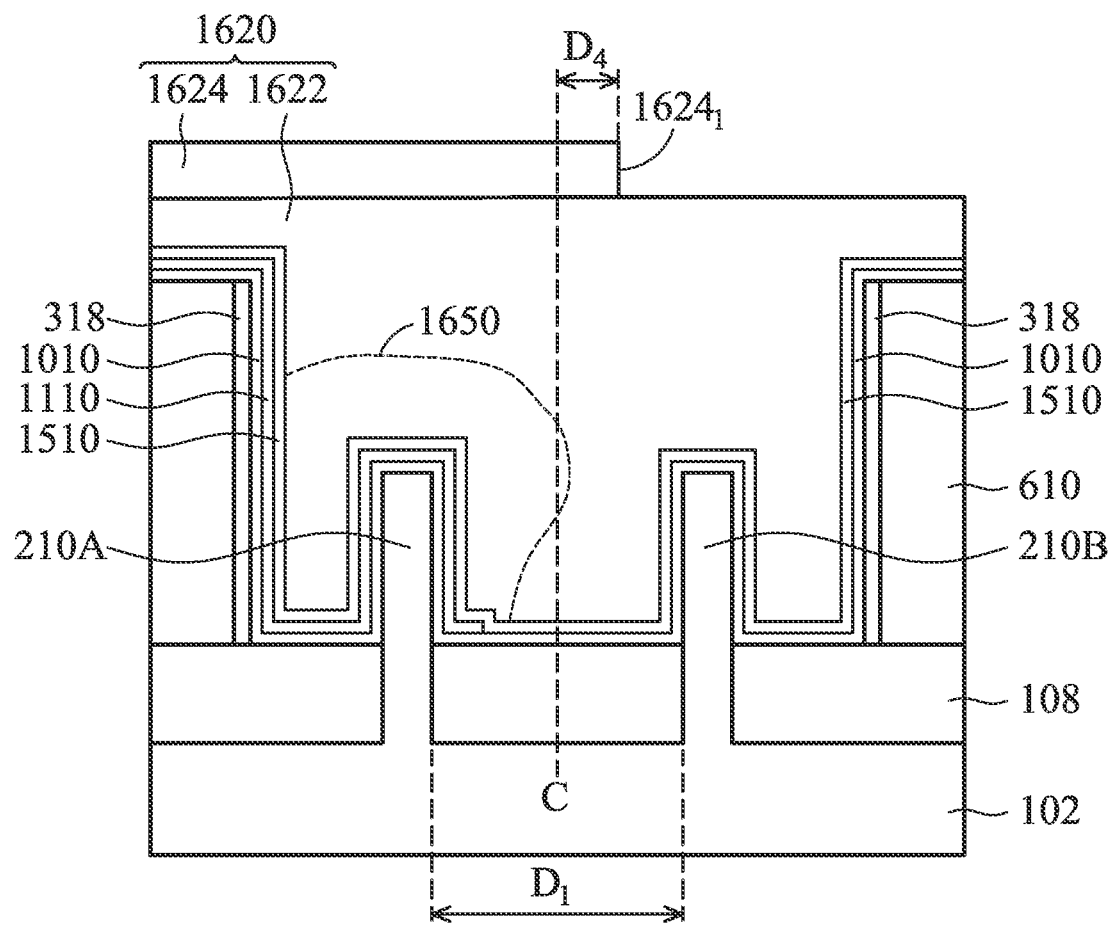

FIGS. 16A-16B illustrate formation of a second mask 1620 to subsequently pattern the second WF layer 1510 in accordance with some embodiments. The respective step is illustrated as step 224 in the process flow shown in FIG. 21. The second mask 1620 may comprise one or more layers of a masking material. For example, FIGS. 16A and 16B illustrate a second sacrificial layer 1622 formed over the second WF layer 1510. The second sacrificial layer 1622 may be formed of a BARC, which may be formed of similar materials and by similar processes as discussed above with reference to the first sacrificial layer 1222. Additionally, the second mask layer 1620 may comprise one or more additional masking layers, such as the second patterned mask 1624. In some embodiments, the second patterned mask 1624 may be a photoresist exposed and developed to form the pattern as illustrated in FIGS. 16A and 16B. Additional masks, such as a silicon oxide, silicon nitride, combinations thereof, or the like may be used in addition to, or instead of, the photoresist mask to provide additional protections during etching.

As illustrated in FIGS. 16A and 16B, the second patterned mask 1624 is shifted from a center line C between the first fin $210_A$ and the second fin $210_B$ toward the second fin $210_B$. In some embodiments, the dimensions of the opening in the ILD 610 after forming various layers (e.g., the first WF layer 1110 and the second WF layer 1510) may hinder or prevent the subsequent mask from sufficiently covering and protecting the underlying layers during a subsequent etch process. As a result, voids may form in, for example, the second sacrificial layer 1622, and during an etch process to pattern the second WF layer 1510 the voids in the second sacrificial layer 1622 mask layer may allow etchants to undesirably remove portions of the second WF layer 1510 over the first fin $210_A$. For illustrative purposes, a void is illustrated in FIG. 16B by the dotted region indicated by reference numeral 1650. As illustrated, by shifting the edge $1224_1$ of the first patterned mask 1224 toward the first fin 210A and shifting an edge $1624_1$ of the second patterned mask 1624 toward the second patterned mask 210B, sufficient amounts of the second sacrificial layer 1622 remains to prevent etching into the void 1650 and into the work function layers.

In some embodiments, a shift distance $D_4$ from the center line C toward the second fin $210_B$ is between about 6 nm and about 40 nm. In some embodiments, the shift distance $D_4$ is about 20% to about 40% of the distance $D_1$ between the first fin $210_A$ and the second fin $210_B$. In some embodiments, an edge of the second work function layer 1510 extends a distance $D_5$ from the first fin $210_A$ as illustrated in FIG. 17B of about 20 nm to about 90 nm.

Figure 17A:
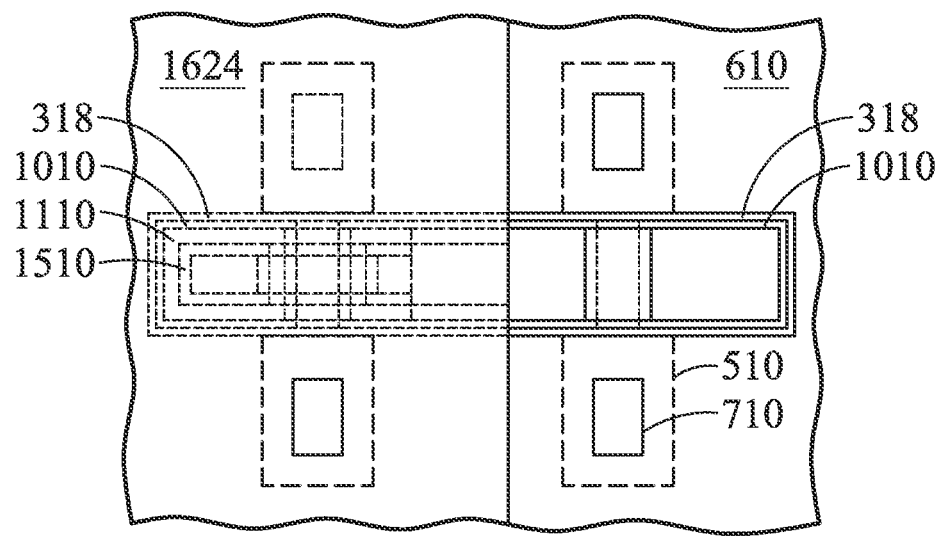
Figure 17B:
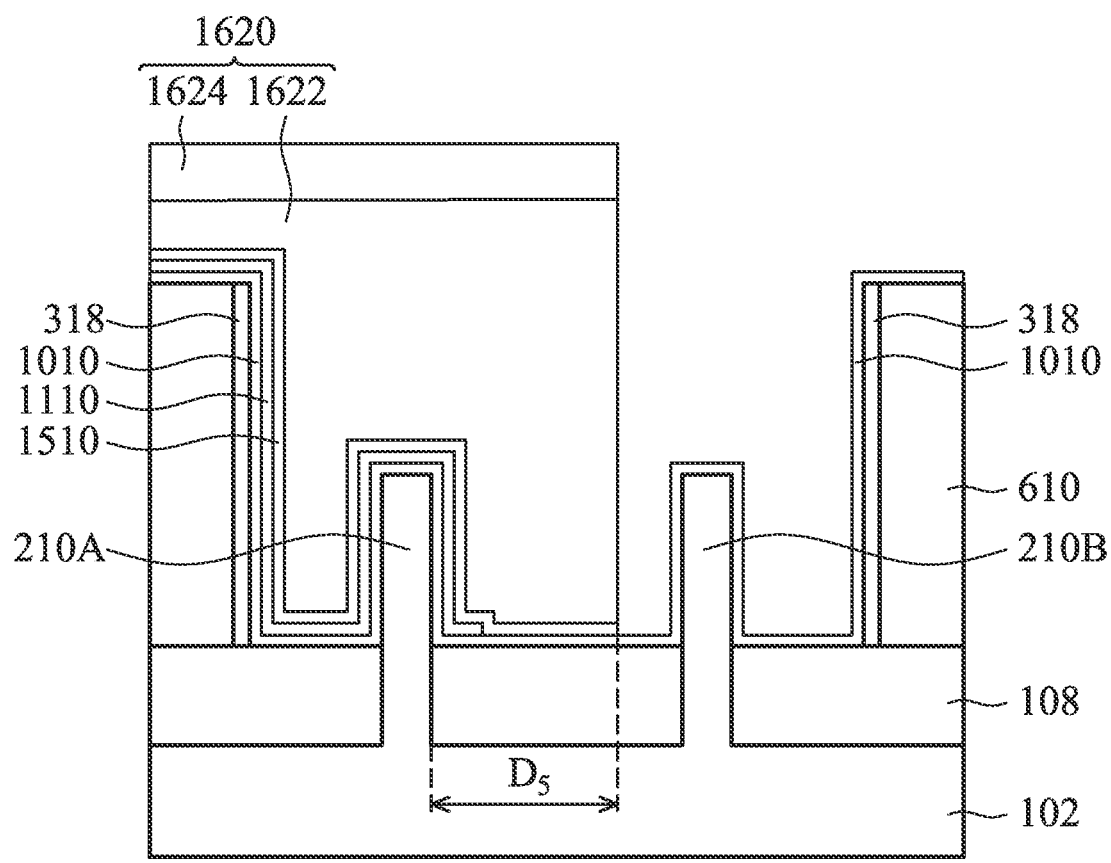

Next, as shown in FIGS. 17A and 17B, the second patterned mask 1624 is used as an etching mask to pattern the second sacrificial layer 1622 and the second WF layer 1510. The respective step is illustrated as step 224 in the process flow shown in FIG. 21. In embodiments in which the second sacrificial layer 1622 is formed of bottom antireflective coating, the second sacrificial layer 1622 may be etched using a dry etch process, or other suitable etching processes, may be used. In the case dry etching is used, the process gas may include $N_2$, $O_2$, $CH_4$, $CF_4$, $CHF_3$, $NF_3$, $SF_6$, $Br_2$, HBr, $Cl_2$ or combinations thereof. Diluting gases such as $N_2$, $O_2$, or Ar may optionally be used. In some embodiments, the sacrificial layer 1222 may be patterned as the resist underlayer film described in U.S. Pat. No. 8,481,247, which is incorporated herein by reference in its entirety. Thereafter, a wet etch process, or other suitable etching processes, may be used to pattern the underlying second work function layer 1510. For example, in embodiments in which the second work function layer 1510 is formed of TiN, a wet etching process using $NH_4OH+H_2O_2+H_2O$ (APM), and/or the like, may be used. Other processes and materials may be used.

Figure 18A:
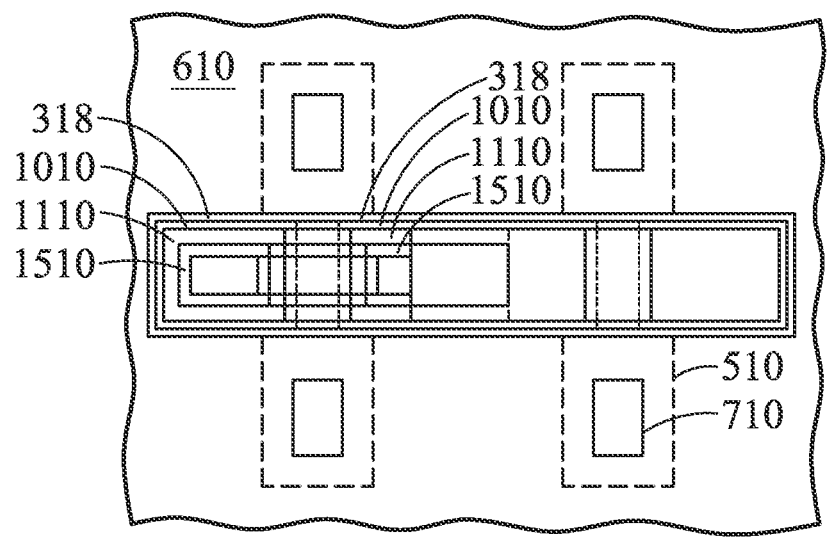
Figure 18B:
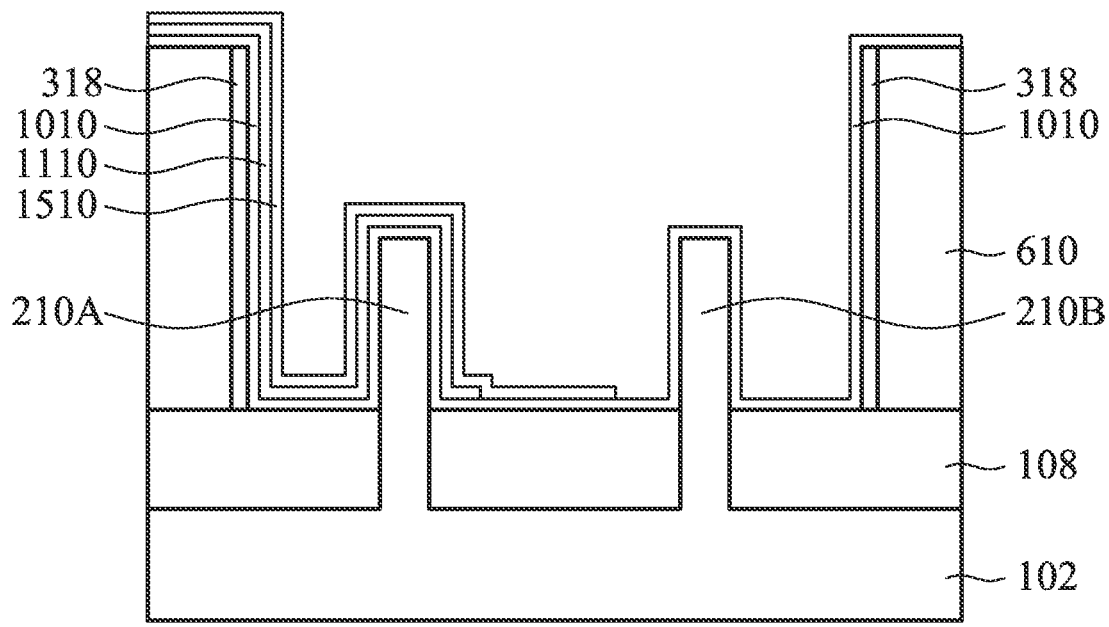

FIGS. 18A and 18B illustrate removal of the second patterned mask 1624 and the second sacrificial layer 1622. The respective step is illustrated as step 224 in the process flow shown in FIG. 21. In an embodiment in which the second patterned mask 1624 is formed of a patterned photoresist, the second patterned mask 1624 may be removed using an ashing process in an ambient of $N_2$, $H_2$, or $O_2$ and a temperature of about 150° C. to about 300° C. In an embodiment in which the second sacrificial layer 1622 is formed of bottom antireflective coating, the second sacrificial layer 1622 may be removed using, for example, an ashing process in an ambient of $N_2$, $H_2$, or $O_2$, and a temperature of about 150° C. to about 350° C.

Figure 19A:
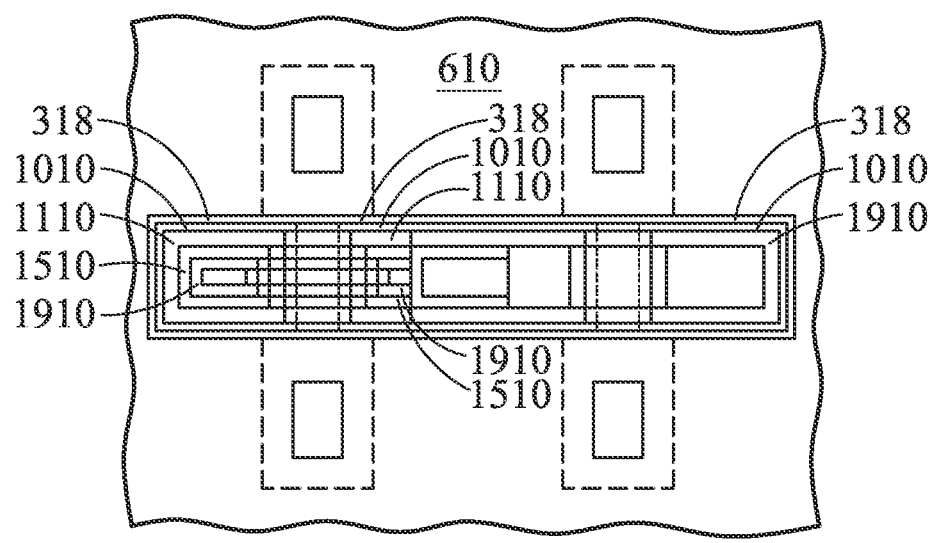
Figure 19B:
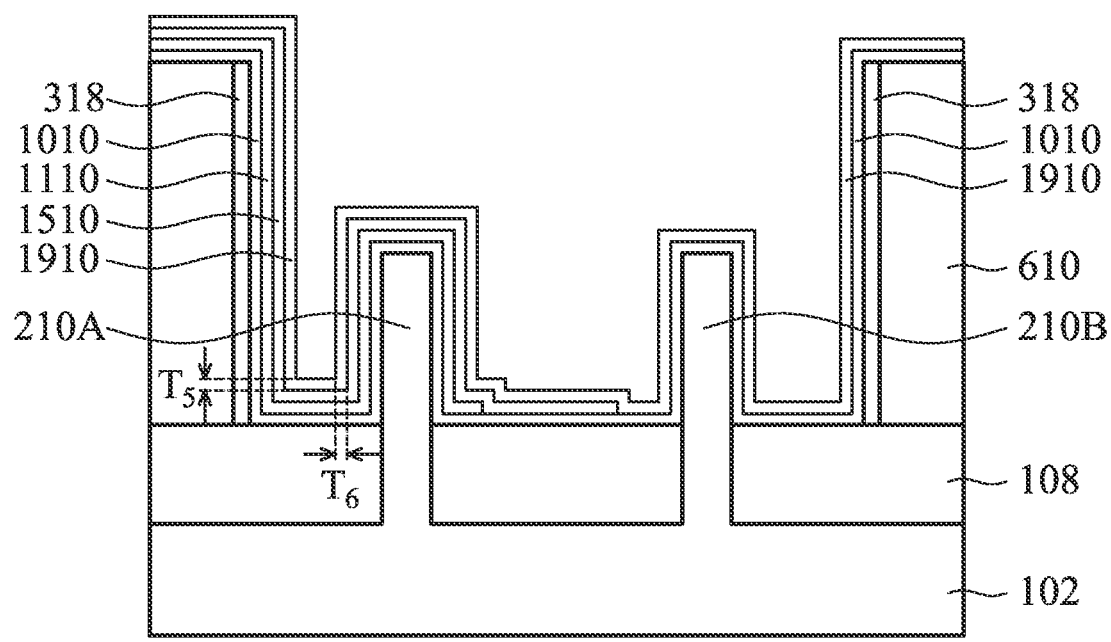

Thereafter, as illustrated in FIGS. 19A and 19B, a third work function layer 1910 is formed over the second work function layer 1510 in the area of the first fin $210_A$ and over the second fin $210_B$. The respective step is illustrated as step 226 in the process flow shown in FIG. 21. In an embodiment, the third work function layer 1910 is formed through deposition, such as a conformal deposition method such as ALD or CVD, so that the horizontal thickness $T_5$ of the horizontal portions and vertical thickness $T_6$ of vertical portions of third work function layer 1910 have thicknesses substantially equal to each other. For example, horizontal thickness $T_5$ and vertical thickness $T_6$ may have a difference smaller than about 20 percent or 10 percent of thickness $T_5$. The thickness $T_5$ may be in the range between about 5 Å and about 50 Å.

FIGS. 20A and 20B illustrate filling the remaining opening with a gate electrode 2020 in accordance with an embodiment. The respective step is illustrated as step 228 in the process flow shown in FIG. 21. The gate electrode 2020 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode 2020 comprises a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 2020 has a thickness in the range of about 5 nm to about 100 nm. The gate electrode 2020 may be formed using a suitable process such as ALD, CVD, PVD, plating, or combinations thereof. A planarization process, such as a CMP, may be performed to remove excess materials of the gate dielectric 1010, the first work function layer 1110, the second work function layer 1510, the third work function layer 1910, and the gate electrode 2020 from the upper surface of the ILD 610.

Other processes may be performed. For example, additional dielectric layers may be formed and metallization layers may be formed to interconnect the various transistors and/or other devices to form circuits, external connectors may be formed, a singulation process may be performed, and/or the like.

The materials and processes describe an example in which the fin $210_A$ is a PMOS transistor having three work function layers and fin $210_B$ is a NMOS transistor having one work function layer. For example, fin $210_A$ may be a PMOS transistor having three work function layers, wherein the first work function layer is TiN or other p-type metal, the second work function layer is TiN or other p-type metal, and the third work function layer is TiAl or other n-type metal. In this example, the fin $210_B$ may be a NMOS having a single work function layer of TiAl or other n-type metal.

As another example in which the fin $210_A$ is an NMOS transistor having three work function layers and fin $210_B$ is a PMOS transistor having one work function layer. Other materials and configuration may be used. For example, fin $210_A$ may be an NMOS having three work function layers, wherein the first work function layer is TiAl or other n-type metal, the second work function layer is TiAl or other n-type metal, and the third work function layer is TiN or other p-type metal. In this example, the fin $210_B$ may be a PMOS having a single work function layer of TiN or other P-type metal.

In accordance with an embodiment, a method is provided. The method includes forming a first dielectric layer over a first fin and a second fin; forming a recess in the first dielectric layer, the first fin and the second fin protruding above a bottom of the recess; forming a first work function layer over the first fin and the second fin; forming a first patterned mask over the first work function layer, the first patterned mask terminating closer to the first fin than the second fin such that the first work function layer over the second fin is exposed; removing the first work function layer from over the second fin and an area between the first fin and the second fin, the first work function layer terminating at a position closer to the first fin than the second fin; and removing the first patterned mask. A second work function layer is formed over the first work function layer and the second fin, a second patterned mask is formed over the second work function layer, the second patterned mask terminating closer to the second fin than the first fin such that the second work function layer over the second fin is exposed, the second work function layer is removed from over the second fin and an area between the first fin and the second fin, the second work function layer terminating at a position closer to the second fin than the first fin, and the second patterned mask is removed. The method further includes forming a third work function layer over the second work function layer and the second fin; and forming a metal layer over the third work function layer.

In accordance with an embodiment, a method is provided. The method includes forming a first work function layer over a first fin, the first work function layer terminating closer to the first fin than a second fin; forming a second work function layer over the first work function layer, the second work function layer terminating closer to the second fin than the first fin; forming a third work function layer over the second work function layer, the third work function layer extending over the second fin; and forming a metal layer over the third work function layer.

In accordance with an embodiment, a device is provided. The device includes a first fin; a second fin; a first work function metal layer extending over the first fin, the first work function metal layer terminating at a first location closer to the first fin than the second fin, the first location being between the first fin and the second fin; a second work function metal layer extending over the first work function metal layer, the second work function metal layer terminating at a second location closer to the second fin than the first fin, the second location being between the first fin and the second fin; and a gate electrode over the first fin and the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor structure;
   a second semiconductor structure;
   an isolation region extending continuously from the first semiconductor structure to the second semiconductor structure in a cross-sectional view, wherein the first semiconductor structure and the second semiconductor structure protrudes above the isolation region;
   a first work function layer extending over the first semiconductor structure and the isolation region, the first work function layer terminating at a first location over the isolation region closer to the first semiconductor structure than the second semiconductor structure;
   a second work function layer extending over the first work function layer and the isolation region, the second work function layer terminating at a second location over the isolation region closer to the second semiconductor structure than the first location; and
   a gate fill material over the first semiconductor structure and the second semiconductor structure.

2. The semiconductor device of claim 1, wherein the first semiconductor structure is a first fin, wherein the second semiconductor structure is a second fin.

3. The semiconductor device of claim 1, further comprising a dielectric layer, wherein the first work function layer and the second work function layer extends along a sidewall of the dielectric layer.

4. The semiconductor device of claim 3, further comprising a spacer between the dielectric layer and the first work function layer.

5. The semiconductor device of claim 1, further comprising a gate dielectric layer over the first semiconductor structure and the second semiconductor structure.

6. The semiconductor device of claim 5, wherein the gate dielectric extends continuously from the first semiconductor structure to the second semiconductor structure.

7. The semiconductor device of claim 1, further comprising a third work function layer over the second work function layer and the second semiconductor structure, the gate fill material being over the third work function layer.

8. A semiconductor device comprising:
   a first transistor, the first transistor comprising:
     a first semiconductor channel region;
     a first gate dielectric over the first semiconductor channel region;
     a first conductive layer over the first gate dielectric;
     a second conductive layer over the first gate dielectric; and
     a first gate fill material over the first conductive layer;
   a second transistor, the second transistor comprising:
     a second semiconductor channel region;
     a second gate dielectric over the second semiconductor channel region;
     the second conductive layer over the second gate dielectric, the second conductive layer extending continuously from the first semiconductor channel region to the second semiconductor channel region, wherein a first end of the first conductive layer terminates at a point closer to the first semiconductor channel region than the second semiconductor channel region; and
     the first gate fill material over the second conductive layer, the first gate fill material extending continuously from over from the first semiconductor channel region to over the second semiconductor channel region; and
   an isolation region between the first transistor and the second transistor, wherein the isolation region extends continuously from the first semiconductor channel region to the second semiconductor channel region in a cross-sectional view.

9. The semiconductor device of claim 8, wherein the first gate dielectric and the second gate dielectric extends continuously over the isolation region.

10. The semiconductor device of claim 8, wherein a distance from the first semiconductor channel region to the first end of the first conductive layer is 10% to 30% of a distance between the first semiconductor channel region and a mid-point between the first semiconductor channel region and the second semiconductor channel region.

11. The semiconductor device of claim 8, wherein the first transistor comprises a third conductive layer between the first conductive layer and the second conductive layer, wherein a second end of the third conductive layer terminates at a second point closer to the second semiconductor channel region than the first semiconductor channel region.

12. The semiconductor device of claim 11, wherein the first end is in a range of 10 nm to 40 nm from the first semiconductor channel region, wherein the second end is in a range of 20 nm to 90 nm from the first semiconductor channel region.

13. The semiconductor device of claim 8, further comprising a spacer completely surrounding the first gate fill material in a plan view.

14. A semiconductor device comprising:
a first dielectric layer over a substrate;
a gate structure in the first dielectric layer, the gate structure extending continuously over a first fin and a second fin, wherein the gate structure comprises:
  a first conductive layer over the first fin, wherein a distance from the first fin to a first end of the first conductive layer between the first fin and the second fin is less than a distance from the second fin to the first end of the first conductive layer;
  a second conductive layer over the first fin and the second fin, wherein the second conductive layer extends continuously from the first fin to the second fin, wherein an upper surface of the first conductive layer and an upper surface of the second conductive layer is level with an upper surface of the first dielectric layer; and
  a gate fill material over the first conductive layer and the second conductive layer, wherein the gate fill material extends continuously from the first fin to the second fin; and
a gate spacer encircling the gate structure in a plan view.

15. The semiconductor device of claim 14, further comprising:
a third conductive layer over the first fin and the second fin, wherein a distance from the first fin to an end of the third conductive layer is greater than a distance from the second fin to the end of the third conductive layer.

16. The semiconductor device of claim 15, wherein the first conductive layer terminates 20% to 40% of a distance between the first fin and the second fin from a mid-point between the first fin and the second fin toward the first fin, wherein the third conductive layer terminates 20% to 40% of the distance between the first fin and the second fin from the mid-point between the first fin and the second fin toward the second fin.

17. The semiconductor device of claim 15, wherein the third conductive layer is between the first conductive layer and the second conductive layer.

18. The semiconductor device of claim 17, wherein the first conductive layer is between the second conductive layer and the substrate.

19. The semiconductor device of claim 14, wherein the gate structure comprises a gate dielectric, the gate dielectric extending continuously from the first fin to the second fin.

20. The semiconductor device of claim 14, wherein the first fin is an adjacent fin to the second fin.

\* \* \* \* \*